(12) United States Patent
Ko et al.

(10) Patent No.: US 12,520,625 B2
(45) Date of Patent: Jan. 6, 2026

(54) SEMICONDUCTOR LIGHT EMITTING DEVICE

(71) Applicant: SAMSUNG ELECTRONICS CO., LTD., Suwon-si (KR)

(72) Inventors: Mingu Ko, Suwon-si (KR); Seungmi Son, Suwon-si (KR); Dongmyung Shin, Suwon-si (KR); Seongseok Yang, Suwon-si (KR); Jongho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/213,608

(22) Filed: Jun. 23, 2023

(65) Prior Publication Data
US 2023/0420610 A1    Dec. 28, 2023

(30) Foreign Application Priority Data

Jun. 23, 2022   (KR) .................. 10-2022-0077090

(51) Int. Cl.
H01L 33/10    (2010.01)
H10H 20/814  (2025.01)
H10H 20/831  (2025.01)
H10H 20/832  (2025.01)

(52) U.S. Cl.
CPC ...... *H10H 20/814* (2025.01); *H10H 20/8314* (2025.01); *H10H 20/835* (2025.01)

(58) Field of Classification Search
CPC ............ H10H 20/814; H10H 20/8314; H10H 20/835; H10H 20/841; H10H 20/833; H10H 20/8312
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

*Primary Examiner* — Mohammed R Alam
(74) *Attorney, Agent, or Firm* — Sughrue Mion, PLLC

(57) ABSTRACT

A semiconductor light emitting device includes a light emitting structure including a first conductivity-type semiconductor layer including an upper surface having a first region and a second region surrounding the first region, and active layer, and a second conductivity-type semiconductor layer, the active layer and the second conductivity-type semiconductor layer being provided in sequence on the first region, a transparent electrode layer provided on the second conductivity-type semiconductor layer, and a distributed Bragg reflector (DBR) layer provided on the insulating layer, the DBR including a first insulating film having a first refractive index and a second insulating film having a second refractive index different from the first refractive index, where the insulating layer and the DBR layer includes a plurality of holes connected to a contact region of the transparent electrode layer.

20 Claims, 19 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,153,398 B2 | 12/2018 | Ko et al. |
| 10,388,832 B2 | 8/2019 | Jang et al. |
| 10,586,896 B2 | 3/2020 | Shioji |
| 10,763,399 B2 | 9/2020 | Lee et al. |
| 2016/0087149 A1 | 3/2016 | Miyachi et al. |
| 2016/0155901 A1 | 6/2016 | Lopez et al. |
| 2020/0395511 A1* | 12/2020 | Yoon .................. H10H 20/833 |

* cited by examiner

SEMICONDUCTOR LIGHT EMITTING DEVICE

CROSS-REFERENCE TO RELATED APPLICATION(S)

This application is based on and claims priority to Korean Patent Application No. 10-2022-0077090, filed on Jun. 23, 2022 in the Korean Intellectual Property Office, the disclosure of which is incorporated herein by reference in its entirety.

BACKGROUND

Example embodiments of the present disclosure relate to a semiconductor light emitting device.

A semiconductor light emitting device has been known as a next-generation light source having advantages such as long lifespan, low power consumption, fast response speed, and environmental friendliness as compared to general light sources, and has drawn attention as an important light source in various products such as a lighting device and also a backlight of a display device.

To increase light extraction efficiency, flip-chip light emitting devices have employed various reflective structures. There may be a limitation for a reflective metal layer to have a large reflective area. Generally, since the reflective metal layer is provided as an electrode connected to a second conductivity-type metal layer, the reflective metal layer may be mainly formed on the upper surface of the mesa structure (that is, connected to the upper surface of the second conductivity-type semiconductor layer). When the reflective metal layer is extended to the side surface of the mesa structure (e.g., to the edge region), a short circuit between the reflective metal layer and the unwanted region (e.g., the first conductivity-type semiconductor layer) may occur through defects in the insulating layer covering the mesa structure. Such defects in the insulating layer (e.g., SiO2) may be caused by particles of a photoresist material when an opening for opening a contact region of the second conductivity-type semiconductor layer (or a transparent electrode layer) is formed in the insulating layer.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a semiconductor light emitting device having improved light extraction efficiency.

Additional aspects will be set forth in part in the description which follows and, in part, will be apparent from the description, or may be learned by practice of the presented embodiments.

According to an aspect of an example embodiment, a semiconductor light emitting device may include a light emitting structure including a first conductivity-type semiconductor layer including an upper surface having a first region and a second region surrounding the first region, and active layer, and a second conductivity-type semiconductor layer, the active layer and the second conductivity-type semiconductor layer being provided in sequence on the first region, a transparent electrode layer provided on the second conductivity-type semiconductor layer, a distributed Bragg reflector (DBR) layer provided on the insulating layer, the DBR including a first insulating film having a first refractive index and a second insulating film having a second refractive index different from the first refractive index, where the insulating layer and the DBR layer includes a plurality of holes connected to a contact region of the transparent electrode layer, and a reflective electrode layer provided on the DBR layer, and connected to the contact region of the transparent electrode layer through the plurality of holes, the reflective electrode layer including an extended portion extending to the DBR layer region on the first region of the first conductivity-type semiconductor layer.

According to an aspect of an example embodiment, a semiconductor light emitting device may include a light emitting structure including a first conductivity-type semiconductor layer including an upper surface having a main region and a peripheral region surrounding the main region, an active layer, and a second conductivity-type semiconductor layer, the active layer and the second conductivity-type semiconductor layer being provided in sequence on the main region, a transparent electrode layer provided on the second conductivity-type semiconductor layer, an insulating layer provided on the light emitting structure and covering the transparent electrode layer, a DBR layer provided on the insulating layer, the DBR layer including first insulating film having a first refractive index and a second insulating film having a second refractive index that is different from the first refractive index, where each of the insulating layer and the DBR layer includes a plurality of holes connected to a contact region of the transparent electrode layer, a reflective electrode layer provided on the DBR layer, and connected to the contact region of the transparent electrode layer through the plurality of holes, the reflective electrode layer including an extended portion provided on the peripheral region of the first conductivity-type semiconductor layer and extending to the DBR layer region, where the extended portion is spaced apart from each edge of the first conductivity-type semiconductor layer by a first distance, a second insulating layer provided on the DBR layer and covering the reflective electrode layer, the second insulating layer including at least one opening exposing one region of the reflective electrode layer, and a connection electrode provided on the second insulating layer and connected to the reflective electrode layer through the at least one opening of the second insulating layer.

According to an aspect of an example embodiment, a semiconductor light emitting device may include a light emitting structure including a first conductivity-type semiconductor layer including an upper surface having a main region and a peripheral region surrounding the main region, an active layer, and a second conductivity-type semiconductor layer, the active layer and the second conductivity-type semiconductor layer being provided in sequence on the main region, where the peripheral region has a width of at least about 10 μm, a transparent electrode layer provided on the second conductivity-type semiconductor layer, a first insulating layer provided on the light emitting structure, and covering the transparent electrode layer, a second insulating layer provided on the first insulating layer and including a material different from a material of the first insulating layer, where each of the first insulating layer and the second insulating layer includes a plurality of holes connected to a contact region of the transparent electrode layer, a reflective electrode layer provided on the second insulating layer, and connected to the contact region of the transparent electrode layer through the plurality of holes, the reflective electrode layer including an extended portion extending to a region of the second insulating layer provided on the peripheral region of the first conductivity-type semiconductor layer, where the extended portion is spaced apart from each edge of the first conductivity-type semiconductor layer by at least about 5 µm, a third insulating layer provided on the second insulating layer and covering the reflective electrode layer, the third insulating layer including at least one opening exposing one region of the reflective electrode layer, and a connection electrode provided on the third insulating layer and connected to the reflective electrode layer through the at least one opening of the third insulating layer.

BRIEF DESCRIPTION OF DRAWINGS

The above and other aspects, features, and advantages of certain example embodiments of the present disclosure will be more apparent from the following description taken in conjunction with the accompanying drawings, in which:

FIGS. 11A and 11B are cross-sectional diagrams illustrating a process of forming portion "C" of the semiconductor light emitting device in FIG. 10B according to an example embodiment of the present disclosure;

FIGS. 12B, 13B and 14B are cross-sectional diagrams illustrating a semiconductor light emitting device taken along line I-I' in FIGS. 12A, 13A and 14A, respectively, according to an example embodiment of the present disclosure.

DETAILED DESCRIPTION

Figure 1:
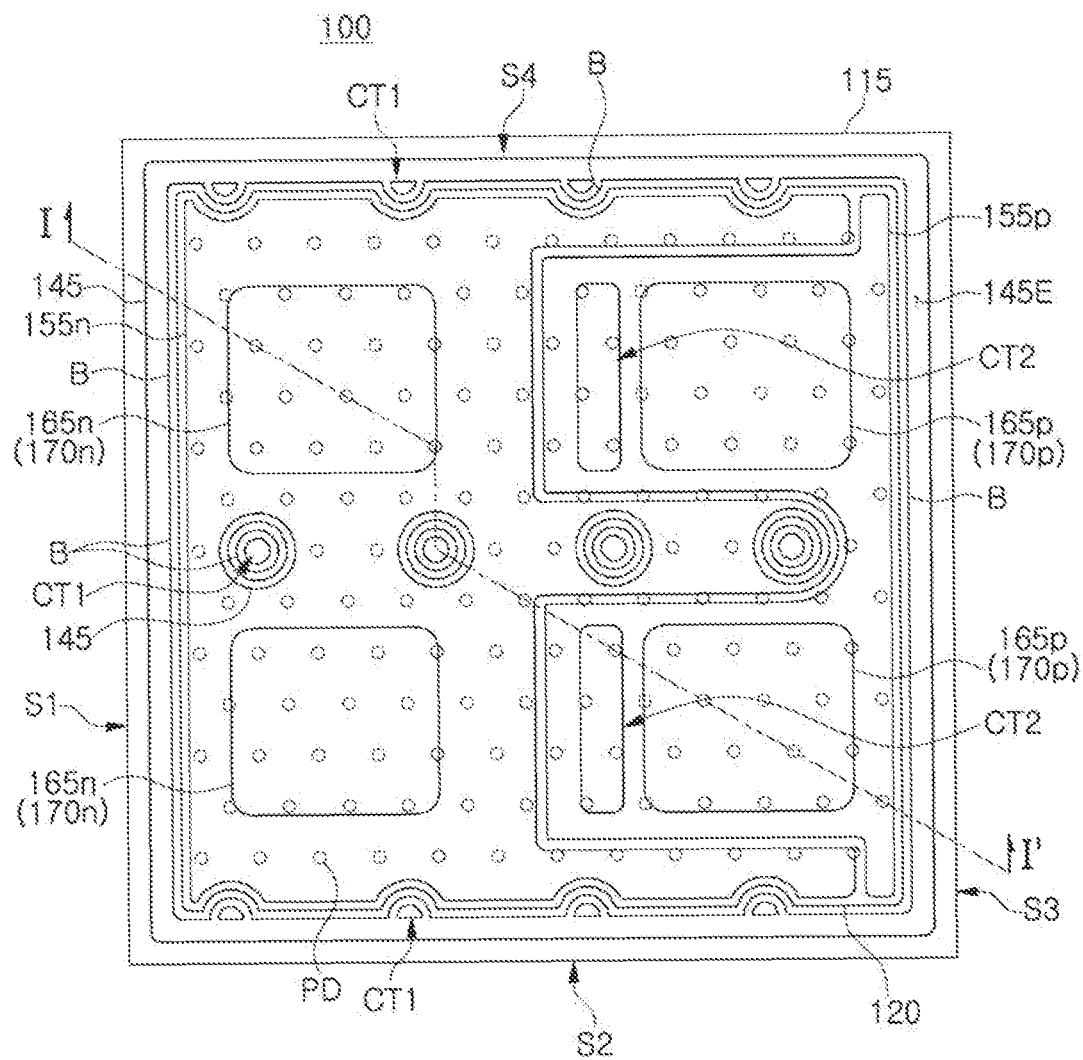
FIG. 1 is a diagram illustrating a semiconductor light emitting device according to an example embodiment of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
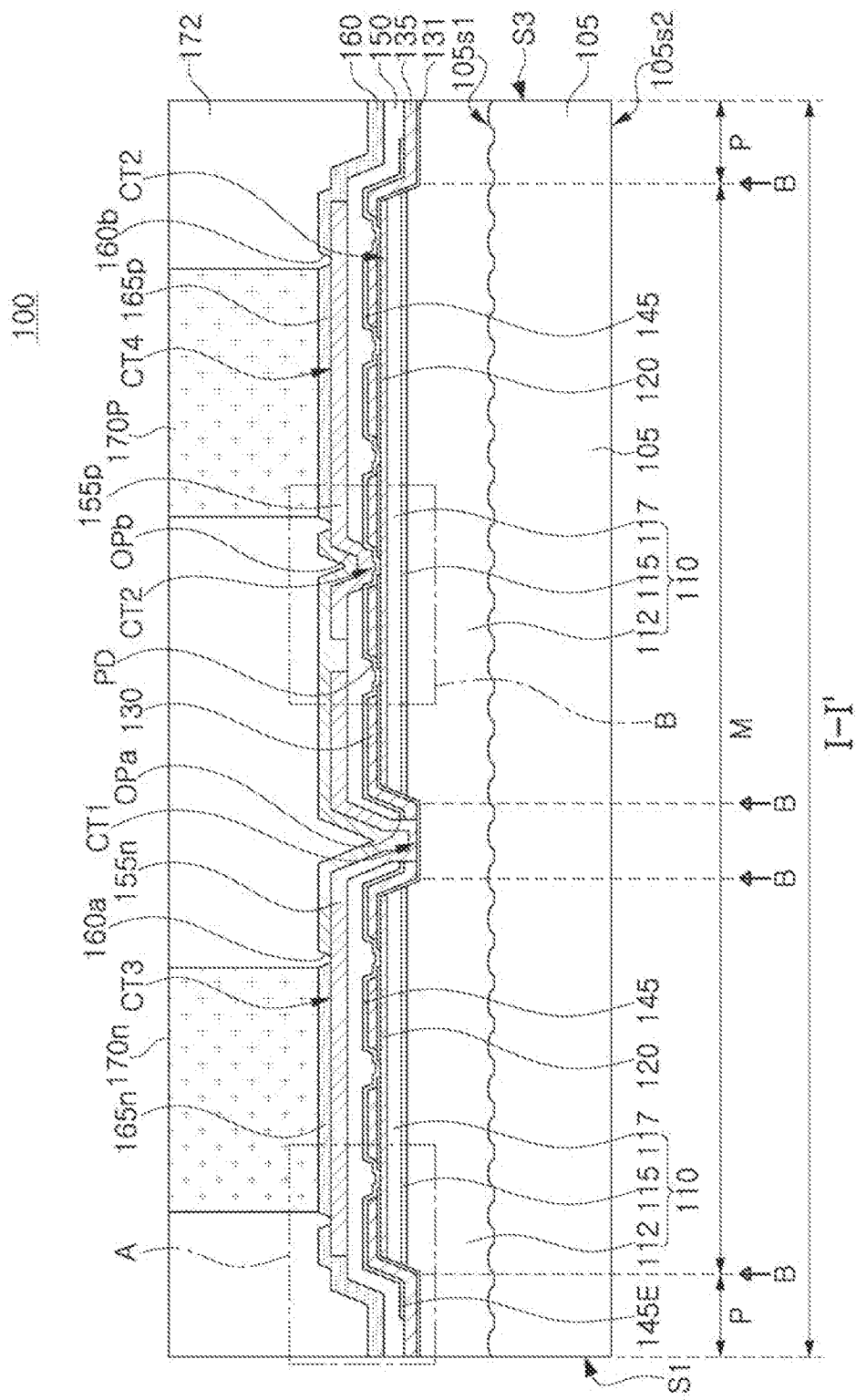
FIG. 2 is a cross-sectional diagram illustrating a semiconductor light emitting device taken long line I-I' in FIG. 1, according to an example embodiment of the present disclosure.

FIG. 1 is a diagram illustrating a semiconductor light emitting device according to an example embodiment of the present disclosure. FIG. 2 is a cross-sectional diagram illustrating a semiconductor light emitting device taken long line I-I' in FIG. 1, according to an example embodiment of the present disclosure.

Referring to FIGS. 1 and 2, a semiconductor light emitting device 100 according to the example embodiment may include a substrate 105, a light emitting structure 110, a transparent electrode layer 120, a first insulating layer 131 (also referred to as "protective insulating layer"), a distributed Bragg reflector (DBR) layer 135 (also referred to as a "dielectric reflective structure"), and a reflective electrode layer 145.

Also, the semiconductor light emitting device 100 may further include a second insulating layer 150, a first connection electrode 155*n*, a second connection electrode 155*p*, a first electrode pad 165*n*, a second electrode pad 165*p*, a first solder post 170*n*, and a second solder post 170*p*.

The substrate 105 may have an upper surface 105*s*1 on which a light emitting structure is formed and a lower surface 105*s*2 opposing the upper surface 105*s*1. The substrate 105 may be configured as a semiconductor growth substrate, and may be formed using an insulating, conductive, and semiconductor material such as sapphire, Si, SiC, $MgAl_2O_4$, MgO, $LiAlO_2$, $LiGaO_2$, GaN, and the like. Sapphire may be a crystal having electrical insulating properties and hexagonal-rhombo R3c symmetry, and may be used as a substrate for nitride semiconductor growth.

In example embodiments, terms such as "upper surface" and "lower surface" may be used to distinguish relative positions of the components, and the example embodiments are not limited to those terms. Accordingly, terms such as "upper surface" and "bottom surface" may be replaced with other terms, such as, for example, "first surface" and "second surface." Accordingly, the upper surface 105*s*1 and the lower surface 105*s*2 of the substrate 105 may be referred to as the first surface 105*s*1 and the second surface 105*s*2 of the substrate 105.

The light emitting structure 110 may be disposed on the upper surface 105*s*1 of the substrate 105.

The upper surface 105*s*1 of the substrate 105 may have a serrated structure, and the serrated structure may improve crystal quality and light extraction efficiency of semiconductor layers included in the light emitting structure 110. In the example embodiment, the serrated structure may have a dome shape, but example embodiments thereof are not limited thereto. For example, the serrated structure may be formed in various shapes such as a quadrangular shape and a triangular shape.

In example embodiments, the substrate 105 may be removed from the final structure. For example, the substrate 105 may be removed through a process of separating a substrate after being used as a growth substrate for growing the light emitting structure 110. In the process of separating the substrate 105, the substrate 105 may be separated from the light emitting structure 110 through a method such as a laser lift-off method or a chemical lift-off method.

A buffer layer may be further provided on the upper surface 105s1 of the substrate 105. The buffer layer may be provided to alleviate lattice defects of the semiconductor layer grown on the substrate 105 and may be configured as an undoped semiconductor layer formed of nitride. Undoped GaN, AlN, and InGaN may be applied to the buffer layer, and may be grown to a thickness of several tens to several hundreds of Å at a low temperature of about 500° C. to about 600° C. The term "undoped" may indicate that an intentional impurity doping process is not performed on the semiconductor layer. However, such a buffer layer is not an essential element and may not be provided in example embodiments.

The light emitting structure 110 may include a first conductivity-type semiconductor layer 112, an active layer 115, and a second conductivity-type semiconductor layer 117.

The first conductivity-type semiconductor layer 112 may be formed by being grown from the upper surface 105s1 of the substrate 105.

As illustrated in FIG. 1, the first conductivity-type semiconductor layer 112 may have a first edge S1, a second edge S2, a third edge S3, and a fourth edge S4. Accordingly, the first and third edges S1 and S3 may oppose each other, and the second and fourth edges S2 and S4 may oppose each other.

The upper surface of the first conductivity-type semiconductor layer 112 may include a peripheral region P adjacent to the first to fourth edges S1, S2, S3, and S4, and a main region M surrounded by the peripheral region P. In example embodiments, the peripheral region P may also be referred to as a first region or an edge region, and the main region M may also be referred to as a second region.

The light emitting structure 110 may further include an active layer 115 and a second conductivity-type semiconductor layer 117 formed in order on the main region M of the upper surface of the first conductivity-type semiconductor layer 112.

Referring to FIGS. 1 and 2, with respect to the light emitting structure 110, the peripheral region P may be a recessed region obtained by etching a portion of the second conductivity-type semiconductor layer 117, the active layer 115 and the first conductivity-type semiconductor layer 112. Similarly, the first contact region CT1 of the first conductivity-type semiconductor layer 112 may be configured as a recessed region (see FIGS. 9A and 9B). The main region M surrounded by the peripheral region P may have a mesa structure in which the second conductivity-type semiconductor layer 117 and the active layer 115 are stacked. In each of the drawings, "B" may indicate a boundary B between the peripheral region P and the main region M, that is, an outer boundary of the mesa structure. Since a portion of the first conductivity-type semiconductor layer 112 may be etched in the peripheral region P, a level of the peripheral region P of the upper surface of the first conductivity-type semiconductor layer may be lower than a level of the main region M.

Also, the mesa structure may have a width decreasing from the lower portion to the upper portion. The mesa structure may have inclined side surfaces.

In example embodiments, the first conductivity-type semiconductor layer 112 may be formed of a semiconductor doped with an n-type impurities, and may be configured as an n-type nitride semiconductor layer. The second conductivity-type semiconductor layer 117 may be formed of a semiconductor doped with a p-type impurities, and may be configured as a p-type nitride semiconductor layer. Each of the first and second conductivity-type semiconductor layers 112 and 117 may have an $Al_xIn_yGa_{(1-x-y)}N$ composition formula (where $0 \leq x<1$, $0 \leq y<1$, $0 \leq x+y<1$), and may include, for example, nitride such as GaN, AlGaN, InGaN, and AlInGaN. The active layer 115 may be interposed between the first and second conductivity-type semiconductor layers 112 and 117. The active layer 115 may emit light having a predetermined energy by recombination between electrons and holes during operation of the semiconductor light emitting device 10. The active layer 115 may include a material having an energy band gap smaller than that of the first and second conductivity-type semiconductor layers 112 and 117. For example, when the first and second conductivity-type semiconductor layers 112 and 117 are a GaN-based compound semiconductor, the active layer 115 may include an InGaN-based compound semiconductor. Also, the active layer 115 may have a multiple quantum well (MQW) structure in which quantum well layers and quantum barrier layers are alternately stacked, such as, for example, an InGaN/GaN structure. However, an example embodiment thereof is not limited thereto, a single quantum well structure (SQW) may be used for the active layer 115.

The transparent electrode layer 120 may be disposed on the second conductivity-type semiconductor layer 117 of the light emitting structure 110. The transparent electrode layer 120 may be disposed in a contact region of the second conductivity-type semiconductor layer 117 and may be electrically connected to the second conductivity-type semiconductor layer 117.

For example, the transparent electrode layer 120 may include at least one selected from among indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$ (zinc magnesium oxide, $0 \leq x \leq 1$). The thickness of the transparent electrode layer 120 may be in the range of about 1 nm to about 5 nm, but an example embodiment thereof is not limited thereto.

In the example embodiment, the first insulating layer 131 and the DBR layer 135 may be disposed in sequence on the transparent electrode layer 120. Each of the first insulating layer 131 and the DBR layer 135 may include a plurality of holes PD opening a partial region of the transparent electrode layer 120. In the example embodiment, the plurality of holes PD may be disposed in a hexagonal dense grid from, but an example embodiment thereof is not limited thereto. For example, the plurality of holes PD may be disposed in various shapes such as a rectangular grid form. The plurality of holes PD may have a circular cross-section, but an example embodiment thereof is not limited thereto. For example, the plurality of holes PD may have a polygonal or ring-shaped cross-section.

The first insulating layer 131 employed in the example embodiment may reduce physical impact (e.g., plasma damage) applied to the semiconductor layer 117 (e.g., p-type GaN layer) in the process (see FIGS. 10A, 14A and 14B) of forming the plurality of holes PD in the DBR layer 135. Accordingly, the issue in which electrical properties (Vr or Ir) are deteriorated due to a leakage current of the semiconductor light emitting device 10 may be prevented.

The first insulating layer 131 may include an insulating material having a refractive index equal to or smaller than that of the second conductive semiconductor layer 117 and/or the transparent electrode layer 120 to enhance total reflection properties. For example, the first insulating layer 131 may include at least one of $SiO_2$ and $MgF_2$. The thickness of the first insulating layer 131 may be in the range of about 10 nm to about 200 nm.

The DBR layer 135 may be disposed on the first insulating layer 131 as a dielectric reflective structure. The DBR layer 135 may be disposed in a region corresponding to the upper surface of the second conductivity-type semiconductor layer 117 and also on the peripheral region P of the first conductivity-type semiconductor layer 112 along a sidewall of the mesa structure together with the first insulating layer 131. As illustrated in FIG. 2, the DBR layer 135 may also be formed around the first contact region CT1 disposed in the mesa structure.

Figure 3A:
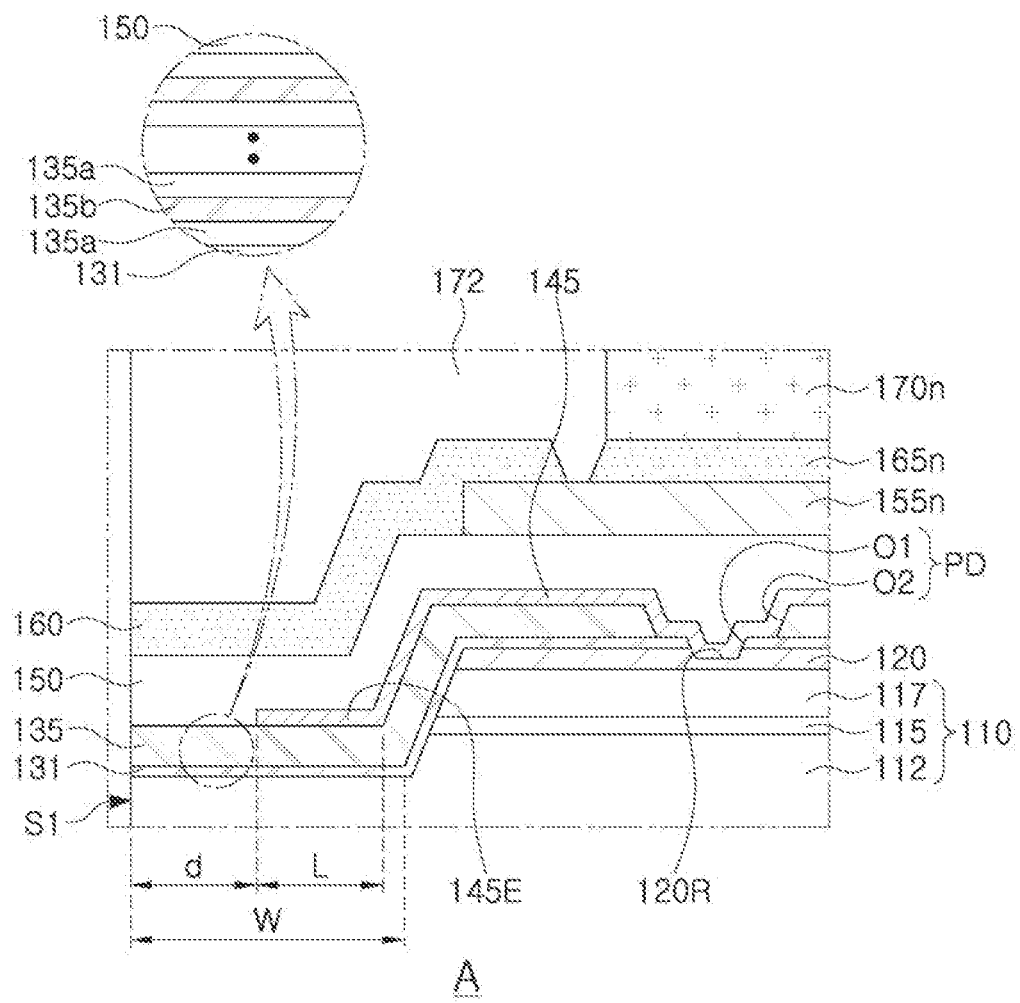
FIG. 3A is a diagram illustrating portion "A" in FIG. 2, according to an example embodiment of the present disclosure.

FIG. 3A is a diagram illustrating portion "A" in FIG. 2, according to an example embodiment of the present disclosure.

As illustrated in FIG. 3A, the DBR layer 135 may include a multilayer film structure in which a first insulating film 135a and a second insulating film 135b having different refractive indices are alternately stacked. For example, the first and second insulating films 135a and 135b may be different material films selected from among $SiO_2$, SiN, $SiO_xN_y$, $TiO_2$, $Si_3N_4$, $Al_2O_3$, TiN, MN, $ZrO_2$, TiAlN, TiSiN, HfO, $NbO_2$, $TaO_2$ and $MgF_2$.

In the example embodiment, at least one of the first insulating film 135a and the second insulating film 135b may include a material different from that of the first insulating layer 131. The DBR layer 135 including the different material may protect the other region of the first insulating layer 131 in an etching process for forming the opening of the first insulating layer 131. In example embodiments, the first insulating film 135a and the first insulating layer 131 may include $SiO_2$, and the second insulating film 135b may include $TiO_2$ or $Nb_2O_5$.

The first insulating layer 131 may include the same material as at least a portion of the DBR layer 135. For example, the first insulating film 135a and the first insulating layer 131 may include $SiO_2$, and when the first insulating film 135a is directly formed on the first insulating layer 131, an interfacial surface between the insulating layer 131 and the DBR layer 135 may be visually distinct (e.g., the transmission electron microscopy (TEM) image). As described above, even though the materials of the first insulating layer 131 and the first insulating film 135a are the same, the first insulating layer 131 and the first insulating film 135a may be formed in different processes, the interfacial surface may be visually distinct.

Figure 3B:
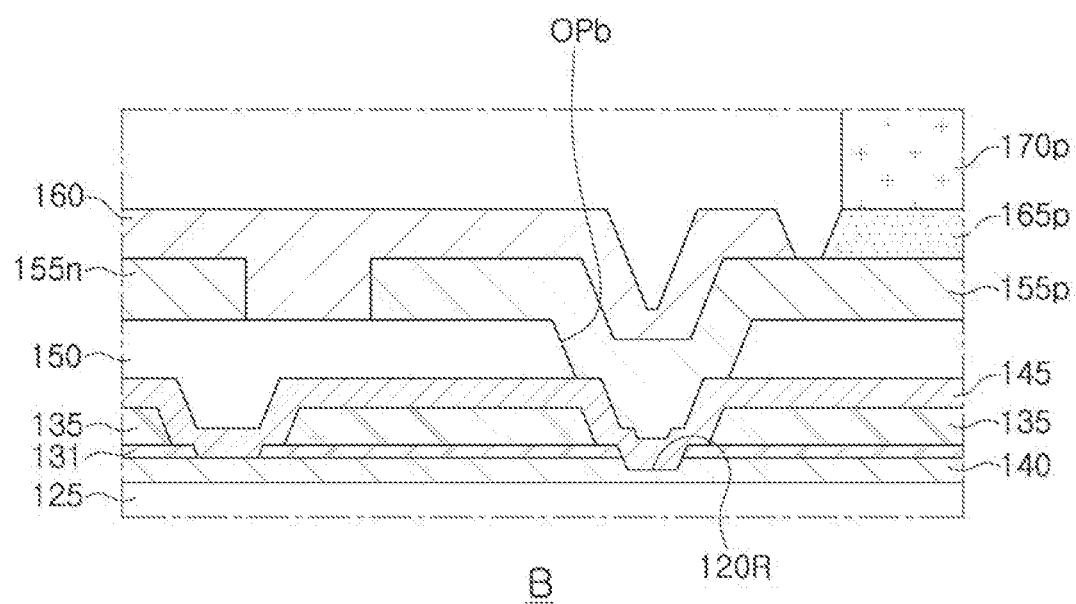
FIG. 3B is a diagram illustration portion "B" in FIG. 2 according to an example embodiment of the present disclosure.

FIG. 3B is a diagram illustration portion "B" in FIG. 2 according to an example embodiment of the present disclosure.

Referring to FIGS. 3A and 3B, the plurality of holes PD may have a first opening O1 formed in the DBR layer 135 and a second opening O2 formed in the first insulating layer 131. In example embodiments, the first and second openings O1 and O2 may be formed using different photolithography processes. The first opening O1 may be formed in the DBR layer 135 using a first etching process (e.g., dry etching), and the second opening O2 may be formed in the first insulating layer 131 using a second etching process (e.g., wet etching) (see FIGS. 14A and 14B). The first opening O1 may be larger than the second opening O2. In the process of forming the second opening O2, the DBR layer 135 may protect the insulating layer 131 in another region (particularly, the peripheral region P) such that defects may not occur in the first insulating layer 131 during a photolithography process.

Also, the region 120R of the transparent electrode layer 120 opened by the plurality of holes PD may be at a level lower than a level of the other regions of the transparent electrode layer 120. In the process of forming the plurality of holes PD, the open region 120R of the transparent electrode layer 120 may be slightly etched and may be at a low level.

The reflective electrode layer 145 may be disposed on the DBR layer 135. The reflective electrode layer 145 may be electrically connected to the transparent electrode layer 120 through the plurality of holes PD. For example, the reflective electrode layer 145 may include Ag, Cr, Ni, Ti, Al, Rh, Ru, Au, or a combination thereof.

The reflective electrode layer 145 may extend to a portion of the DBR layer 135 disposed on the second conductivity-type semiconductor layer 117, and also to a portion of the DBR layer 135 disposed in the peripheral region P. The reflective electrode layer 145 may cover the upper surface and side surfaces of the light emitting structure 110 having a mesa structure and may also cover the peripheral region P toward each of the edges S1, S2, S3, and S4. By increasing the region of the reflective electrode layer 145 covering the light emitting structure 110 as described above, light extraction efficiency may greatly improve.

As such, the reflective metal layer 145 employed in the example embodiment may have a portion 145E extended to a region of the DBR layer 135 disposed on the peripheral region P of the first conductivity-type semiconductor layer 112. The extended portion 145E of the reflective electrode layer 145 may be disposed to be spaced apart from each of the edges S1, S2, S3, and S4 of the first conductivity-type semiconductor layer 112. Through the distance d as above, contamination and/or defects due to the material diffused from the reflective electrode layer 145 during the chip cutting process in the process of manufacturing the semiconductor light emitting device 100 may be prevented. For example, the distance d at which the extended portion 145E of the reflective electrode layer 145 is spaced apart from the edges S1, S2, S3, and S4 may be configured to be at least about 5 μm. In example embodiments, the distance d may be about 5 μm to about 20 μm.

The length L of the extended portion 145E of the reflective electrode layer 145 may be configured to be at least about 5 μm for the effect of improvement in sufficient light extraction. In example embodiments, the length L of the extended portion 145E may be about 5 μm to about 10 μm.

The distance d and the length L of the extended portion 145E may be varied depending on the width W of the peripheral region P. For example, the width W of the peripheral region P may be configured to be at least about 10 μm. The distance d at which the extended portion 145E of the reflective electrode layer 145 is spaced apart from each of the edges S1, S2, S3, and S4 may be in the range of about 50% to about 70% of the width W of the peripheral region P.

In the example embodiment, the dielectric reflective structure may include the DBR layer 135, but in another example embodiment, the dielectric reflective structure may include a low dielectric layer instead of the DBR layer 135 that is formed of a material having a refractive index lower than that of the second conductivity-type semiconductor layer 117. Together with the reflective electrode layer 145 disposed on the low dielectric layer, an omnidirectional reflector (ODR) may be formed. In this case, the low dielectric layer may include a material different from that of the first insulating layer 131.

The second insulating layer 150 may be disposed on the first insulating layer 131 to cover the reflective electrode layer 145. For example, the second insulating layer may include $SiO_2$, SiN, $TiO_2$, HfO, $NbO_2$, $TaO_2$ or $MgF_2$.

Referring to FIGS. 2 and 3B, the DBR layer 135 and the second insulating layer 150 may include a first opening OPa for opening the first contact region CT1 of the first conductivity-type semiconductor layer 112 and a second opening OPb for opening the second contact region CT2 of the reflective electrode layer 145. The first opening OPa may be disposed in a recessed region in the mesa structure, and the second opening OPb may be disposed on the mesa structure.

The first connection electrode 155n may be disposed on the second insulating layer 150, may extend to the first contact region CT1 of the first conductivity-type semiconductor layer 112 through the first opening OPa, and may be electrically connected to the first conductivity-type semiconductor layer 112. The first connection electrode 155n may be in contact with the first contact region CT1 of the first conductivity-type semiconductor layer 112. In an example embodiment, to improve contact resistance properties between the first connection electrode 155n and the first contact region CT1 of the first conductivity-type semiconductor layer 112, a conductive buffer layer may be disposed between the first connection electrode 155n and the first contact region CT1 of the first conductivity-type semiconductor layer 112.

The second connection electrode 155p may be disposed on the second insulating layer 150, may extend to the second contact region CT2 of the reflective electrode layer 145 through the second opening OPb, and may be electrically connected to the reflective electrode layer 145. Accordingly, the second connection electrode 155p may be electrically connected to the second conductivity-type semiconductor layer 117 through the reflective electrode layer 145.

The first connection electrode 155n and the second connection electrode 155p may include the same material layer disposed on the second insulating layer 150, and may be an electrode element obtained such that the same material layers are separated from each other.

On a plane, the first connection electrode 155n may be adjacent to the first edge S1, and the second connection electrode 155p (also referred to as a "connection electrode") may be adjacent to the third edge S3.

The third insulating layer 160 may have a third opening 160a disposed on the first connection electrode 155n and the second connection electrode 155p and exposing the third contact region CT3 of the first connection electrode 155n, and a fourth opening 160b exposing the fourth contact region CT4 of the second connection electrode 155p.

For example, the first connection electrode 155n and the second connection electrode 155p may include a material including one or more of Al, Au, W, Pt, Si, Ir, Ag, Cu, Ni, Ti, and Cr, and alloys thereof.

A first electrode pad 165n may be disposed on the third contact region CT3 of the first connection electrode 155n, and a second electrode pad 165p may be disposed on the fourth contact region CT4 of the second connection electrode 155p. A first solder pillar 170n may be disposed on the first electrode pad 165n, and a second solder pillar 170p may be disposed on the second electrode pad 165p. The first and second solder pillars 170n and 170p may be formed of a conductive material such as Sn or AuSn.

A molding portion 172 covering side surfaces of the first and second solder pillars 170n and 170p may be formed. The molding portion 172 may include light reflective powders such as $TiO_2$ and $Al_2O_3$. A level of an upper surface of the molding portion 172 may be lower than a level of an upper surface of the first and second solder pillars 170n and 170p.

As such, according to the example embodiment, by extending the reflective metal layer 145 to the peripheral region P adjacent to each edge on the dielectric reflective structure such as the DBR layer 135, the light extraction efficiency of the semiconductor light emitting device 100 may greatly improve.

Figure 4:
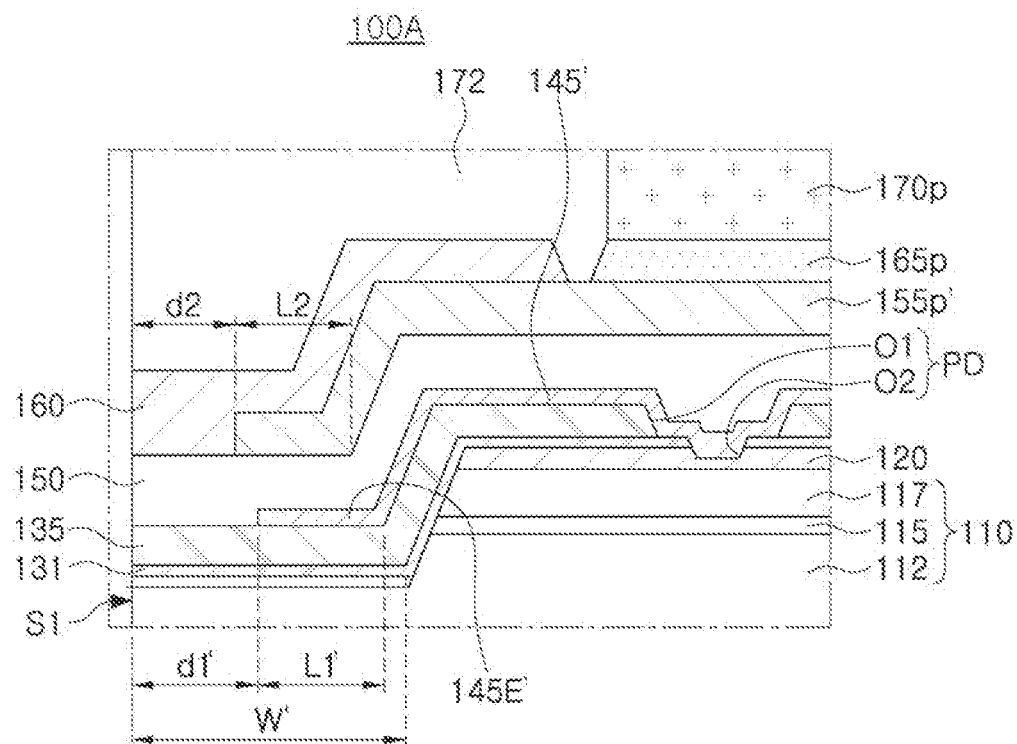
FIG. 4 is a diagram illustrating a semiconductor light emitting device according to an example embodiment of the present disclosure.

FIG. 4 is a diagram illustrating a semiconductor light emitting device according to an example embodiment of the present disclosure.

Referring to FIG. 4, a semiconductor light emitting device 100A according to the example embodiment may be similar to the semiconductor light emitting device 100 illustrated in FIGS. 1 to 3 other than the configuration in which a second connection electrode 155p' is additionally extended, and the arrangement of the reflective electrode layer 145 and the peripheral region P are different. Also, the components in the example embodiment may be understood with reference to the descriptions of the same or similar components of the semiconductor light emitting device 100 illustrated in FIGS. 1 to 3 unless otherwise indicated.

The peripheral region P of the semiconductor light emitting device 100A may have a width W' relatively narrower than that of the previous embodiment. Even when the width of the peripheral region P is narrow, the extended portion 145E' of the reflective electrode layer 145' may be spaced apart from each of the edges S1, S2, S3, and S4, and the distance d1 may be greater than half of the width W' of the peripheral region P. For example, the length L1' of the extended portion 145E may be at least about 5 μm.

Also, to further improve the light extraction effect in the edge region of the semiconductor light emitting device 100A, the second connection electrode 155p' may be further extended to a portion of the second insulating layer 150 disposed in the peripheral region P. The extended portion of the second connection electrode 155p' may be disposed to be spaced apart from each of the edges S1, S2, S3, and S4. The length L2' and/or the distance d2' of the extended portion of the second connection electrode 155p' may be different from the length L1' and/or the distance d1' of the extended portion 145E' of the reflective electrode layer 145'.

The extension of the reflective electrode layer may improve light extraction efficiency at a package level in which the semiconductor light emitting device is employed.

Figure 5:
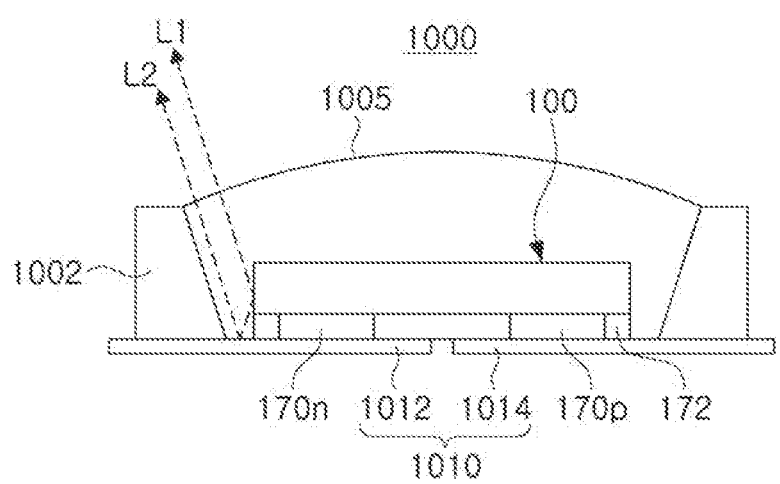
FIG. 5 is a cross-sectional diagram illustrating a semiconductor light emitting device according to an example embodiment of the present disclosure.

FIG. 5 is a cross-sectional diagram illustrating a semiconductor light emitting device according to an example embodiment of the present disclosure.

Referring to FIG. 5, a semiconductor light emitting device package 1000 may include a semiconductor light emitting device 100 which is a light source, a package body 1002, a pair of lead frames 1010, and an encapsulation portion 1005. The semiconductor light emitting device 100 may be the semiconductor light emitting device 100 in FIGS. 1 and 2, and a detailed description thereof will not be provided.

The semiconductor light emitting device 100 may be mounted on the lead frame 1010 by a flip-chip method, and may be electrically connected to the lead frame 1010.

The lead frame 1010 may include a first lead frame 1012 and a second lead frame 1014. The semiconductor light emitting device 100 may be connected to the first lead frame 1012 and the second lead frame 1014 by first solder pillars 170n and second solder pillars 170p, respectively.

The package body 1002 may include a reflective cup to improve light reflection efficiency and light extraction efficiency, and the reflective cup may have the encapsulation portion 1005 formed of a translucent material to encapsulate the semiconductor light emitting device 1001. The encapsulation portion 1005 may include a wavelength conversion material such as phosphors or quantum dots.

In FIG. 5, the light emitted from the edge region of the semiconductor light emitting device is indicated by an arrow corresponding to L1 and L2. The first light L1 may represent light reflected by the DBR layer and the extended reflective electrode layer of the semiconductor light emitting device according to the example embodiment, and the second light L2 may represent light reflected by the lead frame of the package substrate from the edge region of the semiconductor light emitting device.

Figure 6:
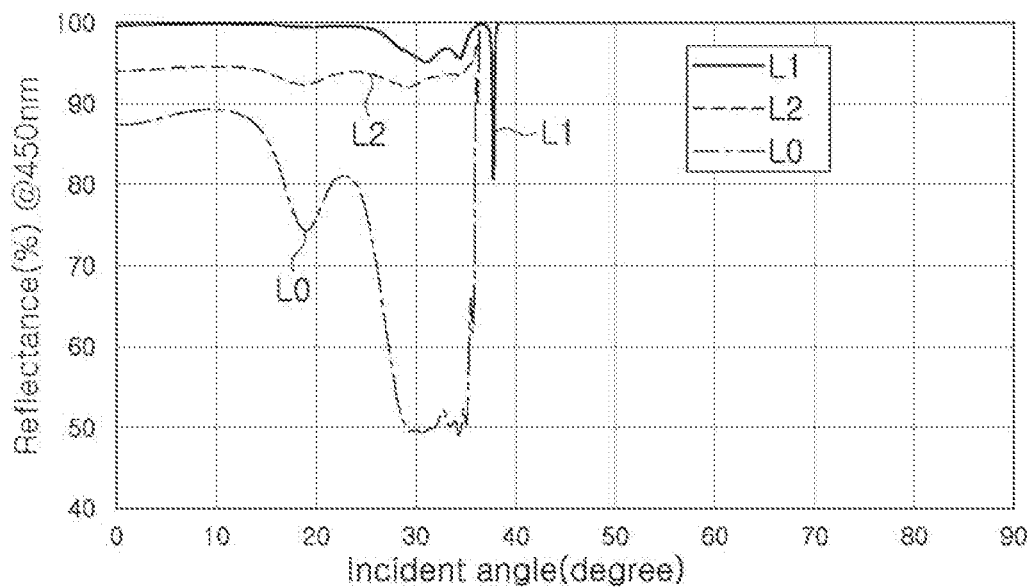
FIG. 6 is a graph illustrating reflectance depending on an optical path in a semiconductor light emitting device package in FIG. 5 according to an example embodiment of the present disclosure.

FIG. 6 is a graph illustrating reflectance depending on an optical path in a semiconductor light emitting device package in FIG. 5 according to an example embodiment of the present disclosure.

Referring to FIG. 6, it is indicated that the first light L1 emitted downwardly from the edge region of the semiconductor light emitting device 100 according to the example embodiment had a reflectance improved further than that of the second light L2 reflected by the semiconductor package. In terms of the weighted average reflectance, the first light L1 may have a reflectance of 99.61%, and the second light L2 may have a reflectance of 98.62%.

In FIG. 6, "L0" denotes light L0 emitted downwardly from the edge region of the semiconductor light emitting device in which the reflective electrode layer is not extended to the peripheral region as in the related art. The weighted average reflectance of this light L0 may only be 94%.

As described above, it is indicated that the reflectance of the first light L1 emitted from the edge region of the semiconductor light emitting device according to the example embodiment was greatly improved as compared to the "L0" of the structure in the related art.

The effect of improvement in light extraction efficiency may vary depending on the extended length of the reflective electrode layer.

The effect of increasing the reflective region and improving light output according to the extended length L of the reflective electrode layer was measured in the case in which a general semiconductor light emitting device (i.e., the example in which the reflective electrode layer is formed only on the upper surface of the mesa structure) is used as a comparative example.

The semiconductor light emitting device was configured as below: the light emitting structure was a GaN structure, the first insulating layer was $SiO_2$ of 530 nm, the DBR layer was formed of 5 pairs of $SiO_2/TiO_2$, and the reflective electrode layer was formed of Ag. Also, the second and third insulating layers were formed of PEOX of 6.6 nm and PEOX of 760 nm, respectively.

According to the result in Table 1 below, it was confirmed that, as the length L of the extended portion increased, the light output was further improved, and when the length was 5 μm, 2% of the improvement effect was expected, which was significant.

TABLE 1

| Length L of extended portion | Area of reflective electrode layer (μm²) | Improvement rate of light output |
|---|---|---|
| 0 (Comparative example) | 772409 | 100% |
| 5 μm | 790101 | 102.29% |
| 6 μm | 793488 | 102.80% |
| 7 μm | 797222 | 103.21% |
| 10 μm | 807951 | 104.60% |

Figure 7:
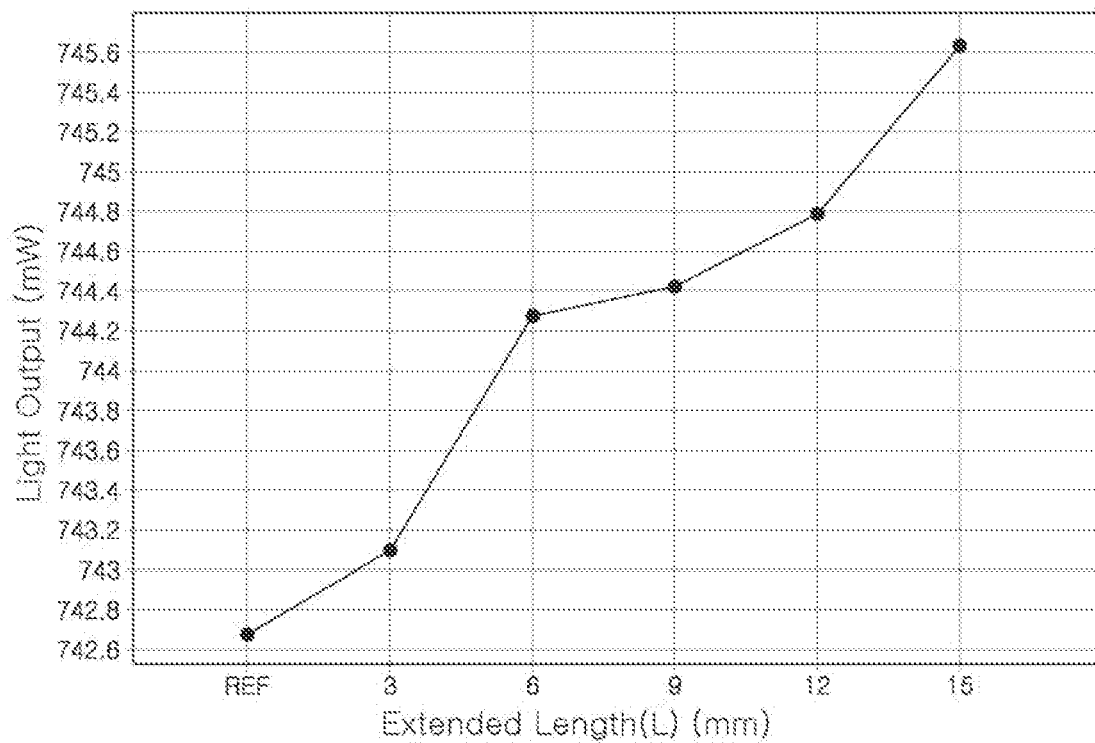
FIG. 7 is a graph illustrating an effect of improving light output depending on an extended length of a reflective layer according to an example embodiment of the present disclosure.

FIG. 7 is a graph illustrating an effect of improving light output depending on an extended length of a reflective layer according to an example embodiment of the present disclosure.

The effect of improvement of light output was evaluated by varying only the extended length L of the reflective electrode layer in the semiconductor light emitting device manufactured under the same conditions. The light output of the example (REF) in which the reflective electrode layer was not extended was 742.7 mW, and it is confirmed that the reflectance in the edge region was improved and gradually increased according to the extended length L of the reflective electrode layer. For example, when the extension length L was 9 μm, it is confirmed that the reflectance was increased to 744.4 mW and was improved by 0.23%.

Figure 8A:
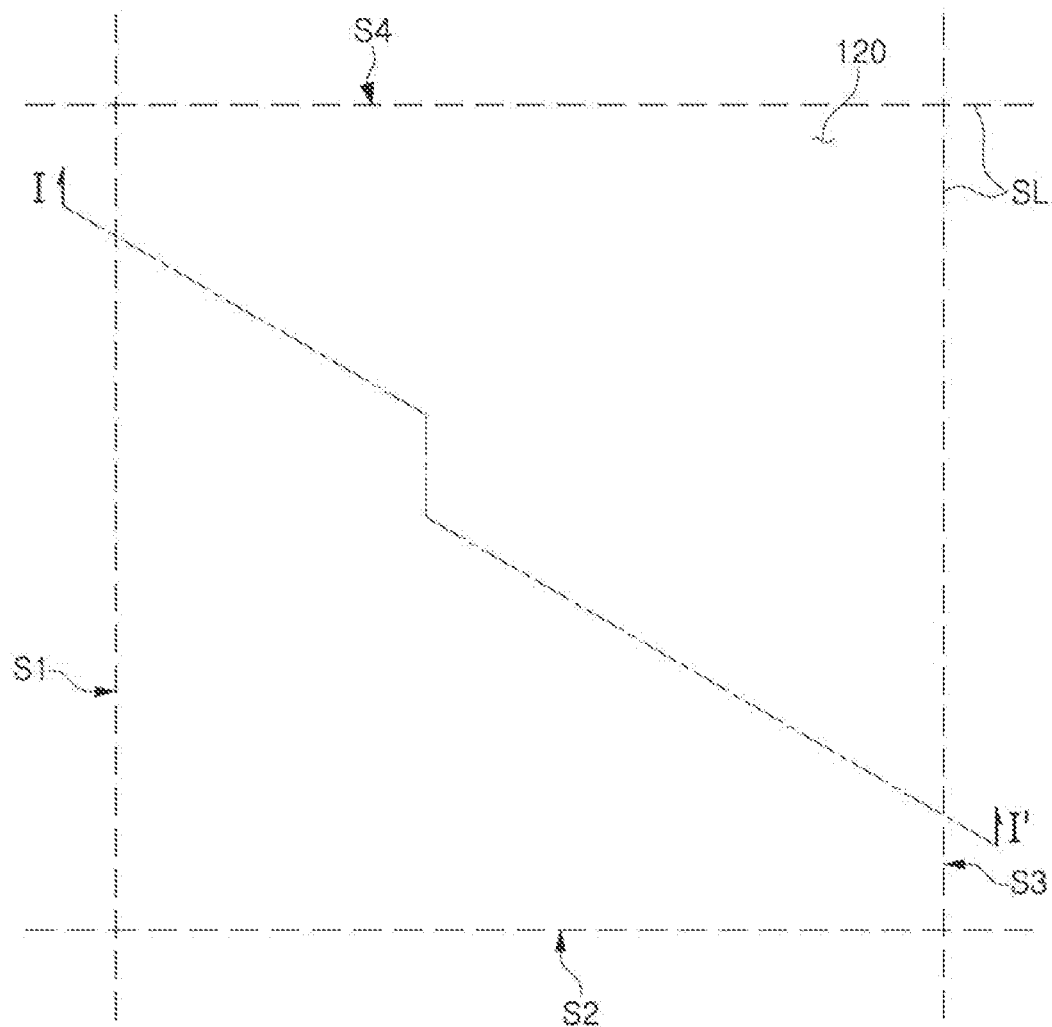
FIGS. 8A, 9A, and 10A are diagrams illustrating a method of manufacturing a semiconductor light emitting device according to an example embodiment of the present disclosure.
Figure 8B:
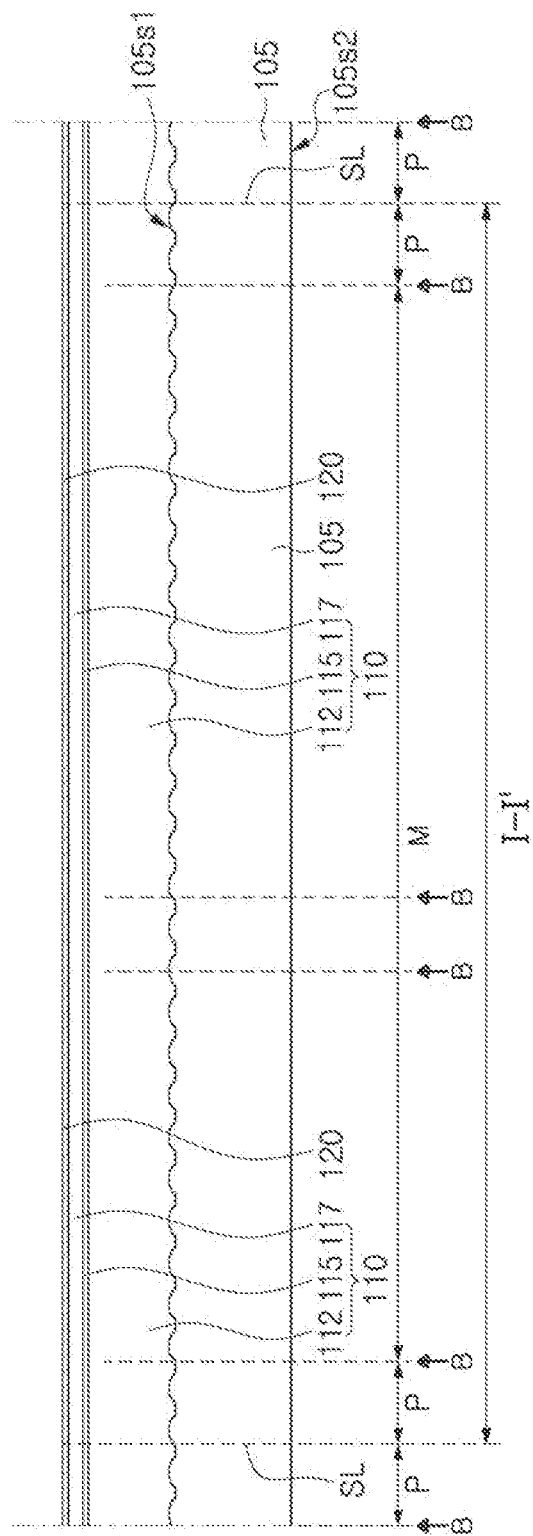
FIGS. 8B, 9B, and 10B, 11B, 12B and 13B are cross-sectional diagrams illustrating a semiconductor light emitting device taken along line I-I' in FIGS. 8A, 9A, and 10A, respectively, according to an example embodiment of the present disclosure.
Figure 9A:
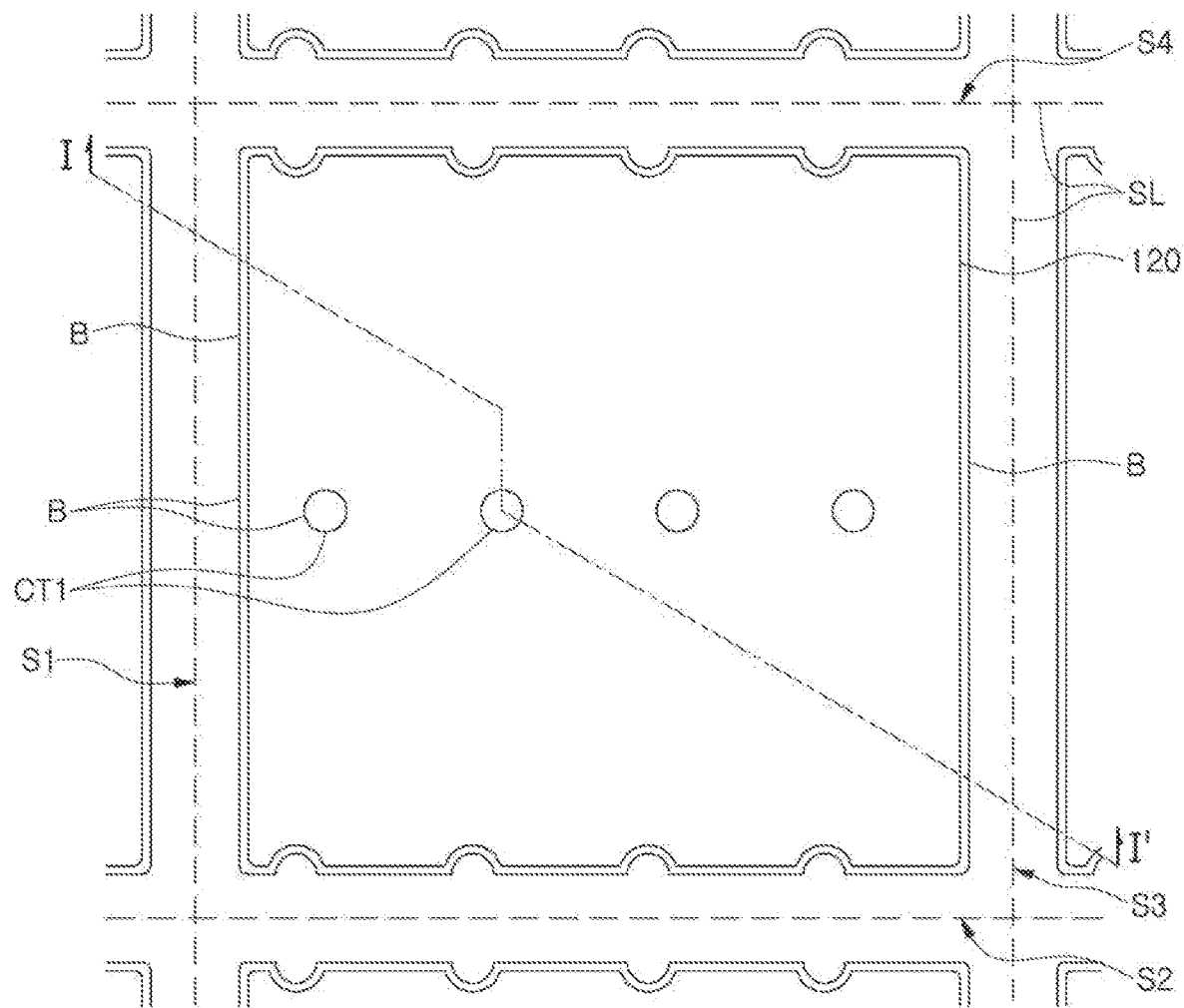
Figure 9B:
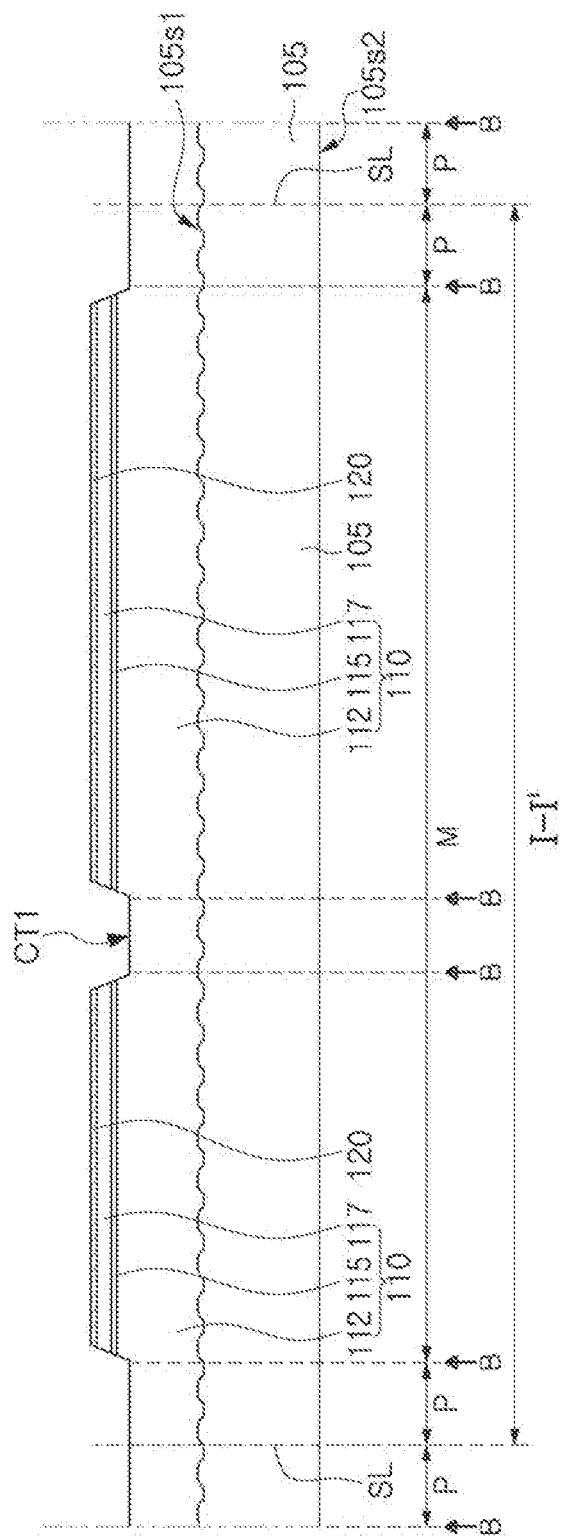
Figure 10A:
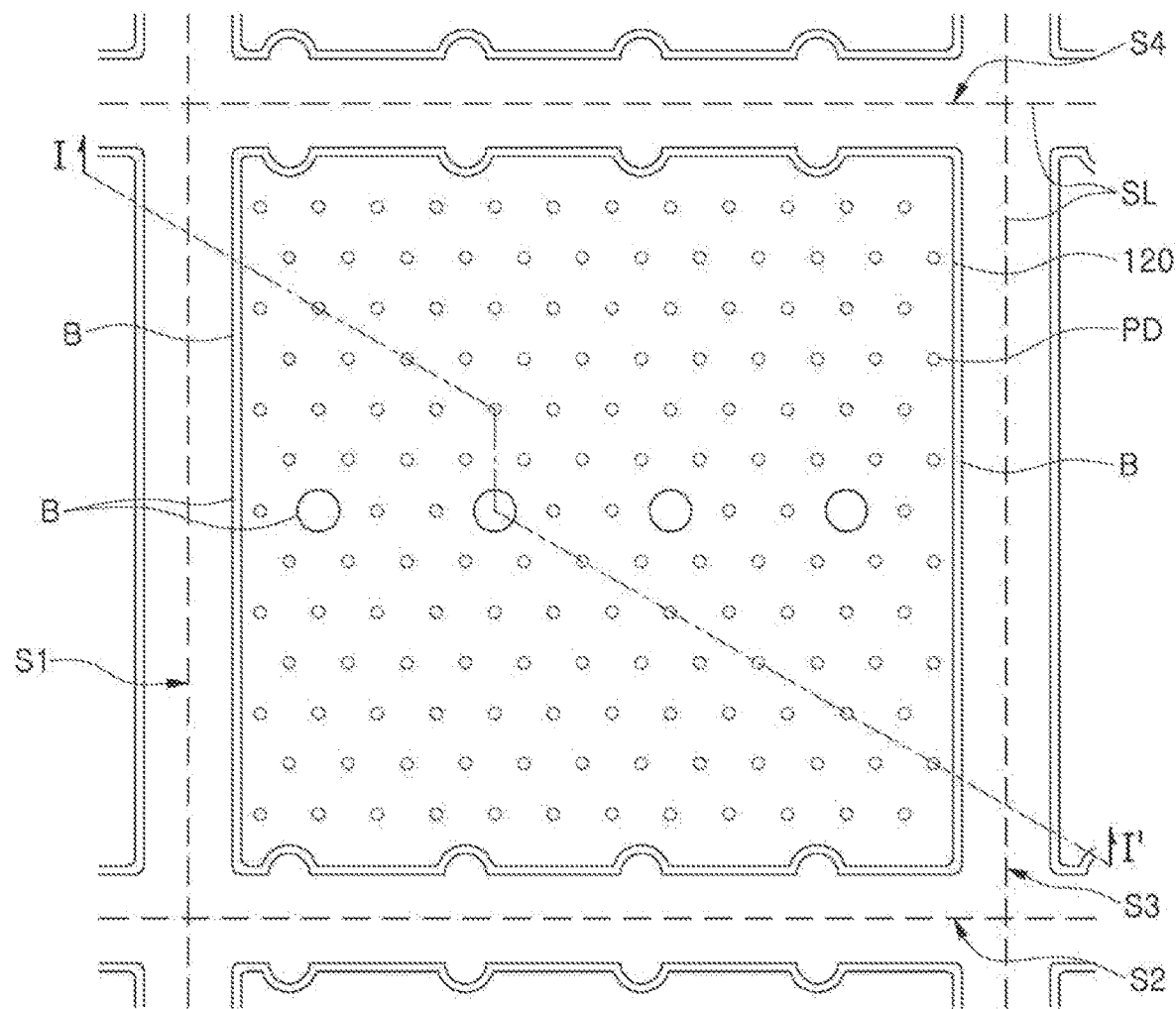

FIGS. 8A, 9A, and 10A are diagrams illustrating a method of manufacturing a semiconductor light emitting device according to an example embodiment of the present disclosure. FIGS. 8B, 9B, and 10B, 11B, 12B and 13B are cross-sectional diagrams illustrating a semiconductor light emitting device taken along line I-I' in FIGS. 8A, 9A, and 10A, respectively, according to an example embodiment of the present disclosure.

Referring to FIGS. 8A and 8B, the light emitting structure 110 may be formed on the substrate 105. The substrate 105 may have an upper surface 105s1 and a lower surface 105s2 opposing the upper surface 105s1.

In the example embodiment, the wafer level in which a plurality of semiconductor light emitting device regions may be arranged before being separated along the scribe lane SL is illustrated. A serrated structure may be formed on the upper surface 105s1 of the substrate 105. In example embodiments, the forming the serrated structure of the upper surface 105s1 of the substrate 105 may not be performed.

The light emitting structure 110 may be formed on the upper surface 105s1 of the substrate 105. The light emitting structure 110 may include a plurality of layers formed by a process such as metal organic chemical vapor deposition (MOCVD), hydrogen vapor phase epitaxy (HYPE), molecular beam epitaxy (MBE), or the like. For example, the light emitting structure 110 may include a first conductivity-type semiconductor layer 112, an active layer 115, and a second conductivity-type semiconductor layer 117 formed in order on the upper surface 105s1 of the substrate 105. The first conductivity-type semiconductor layer 112 and the second conductivity-type semiconductor layer 117 may have different conductivity-types. For example, the first conductivity-type semiconductor layer 112 may have an n-type conductivity-type, and the second conductivity-type semiconductor layer 117 may have a p-type conductivity-type. Additionally, the transparent electrode layer 120 may be formed on the light emitting structure 110.

Referring to FIGS. 9A and 9B, a portion of the transparent electrode layer 120, the second conductivity-type semiconductor layer 117, the active layer 115 and the first conductivity-type semiconductor layer 112 may be etched using a photolithography process and an etching process. Accordingly, in the light emitting structure 110, the recessed region from which a portion of the second conductivity-type semiconductor layer 117, the active layer 115, and the first conductivity-type semiconductor layer 112 is removed may be provided as the peripheral region P surrounding the device regions. In each device region, the peripheral region P may surround the main region M. In each main region M, the second conductivity-type semiconductor layer 117, the active layer 115, and the first conductivity-type semiconductor layer 112 may remain without being etched such that a mesa structure may be formed. In this process, a plurality of (e.g., four) recessed regions may be formed in the mesa structure to open the first contact region CT1 of the first conductivity-type semiconductor layer 112.

Figure 10B:
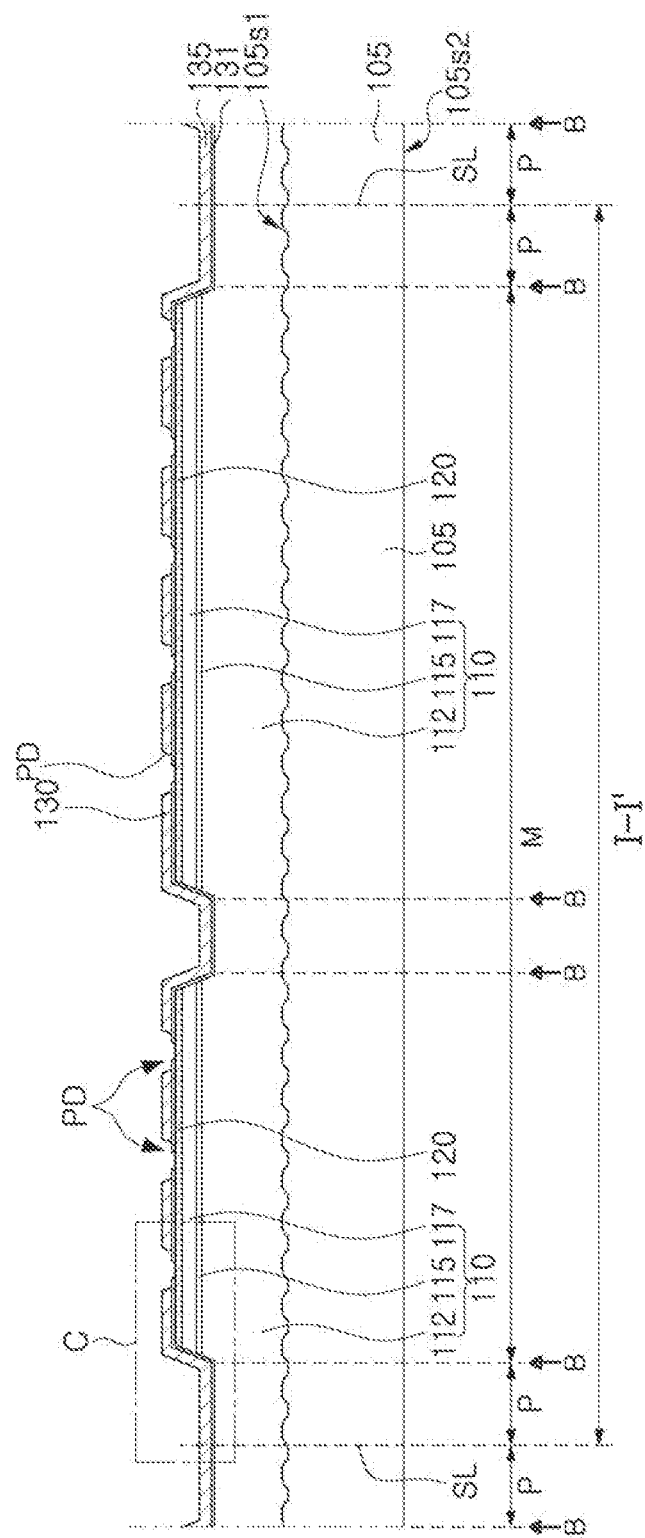

Referring to FIGS. 10A and 10B, the first insulating layer 131 and the DBR layer 135 having a plurality of holes PD may be formed on the light emitting structure 110.

The first insulating layer 131 and the DBR layer 135 may be formed in order on the transparent electrode layer 120, and the plurality of holes PD may penetrate the first insulating layer 131 and the DBR layer 135 and may expose a portion of the transparent electrode layer 120. The plurality of holes PD may be disposed in the mesa region M. The process may be formed through the process illustrated in FIGS. 11A and 11B.

Figure 11A:
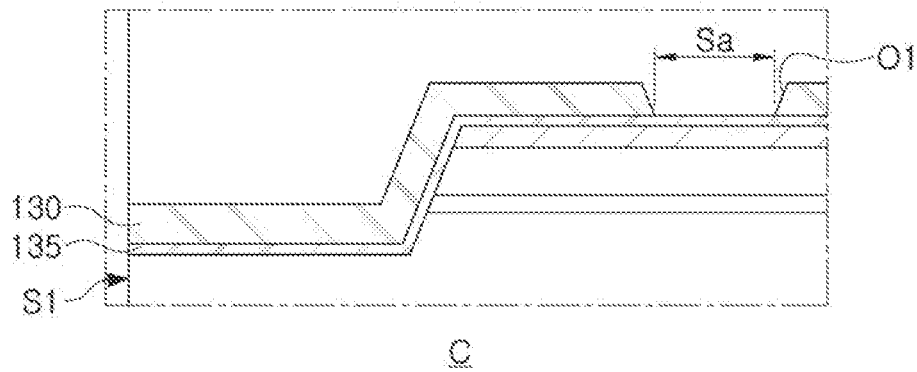
Figure 11B:
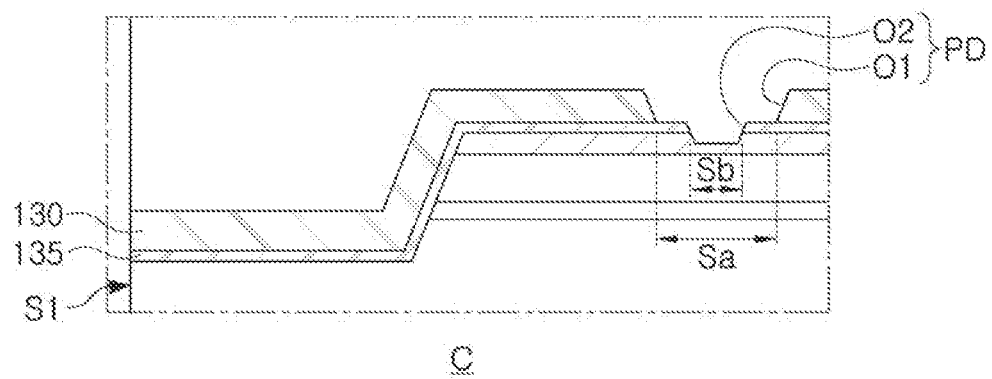

FIGS. 11A and 11B are cross-sectional diagrams illustrating a process of forming portion "C" of the semiconductor light emitting device in FIG. 10B according to an example embodiment of the present disclosure.

Referring to FIG. 11A, an etching process for forming the first opening $O_1$ in the DBR layer 135 may be performed using the first photoresist pattern. This etching process may be performed by dry etching. In this process, the first insulating layer 131 may reduce a physical impact such as plasma damage applied to the transparent electrode layer 120 or the second conductive semiconductor layer 117 (e.g., a p-type GaN layer).

Thereafter, referring to FIG. 11B, an etching process for forming a second opening in the first insulating layer 131 may be performed using the second photoresist pattern. This etching process may be performed by wet etching. Accordingly, the plurality of holes PD including the first opening O1 and the second opening O2 may be formed, and one regions of the transparent electrode layer 120 may be exposed by the plurality of holes PD such that a contact region may be provided. The size S1 of the first opening O1 may be larger than the size S2 of the second opening O2. In particular, in the process of forming the second opening O2, the DBR layer 135 in another region (especially, the peripheral region P) may protect the first insulating layer 131 such that defects may not occur in the first insulating layer 131 during the photolithography process.

Figure 12A:
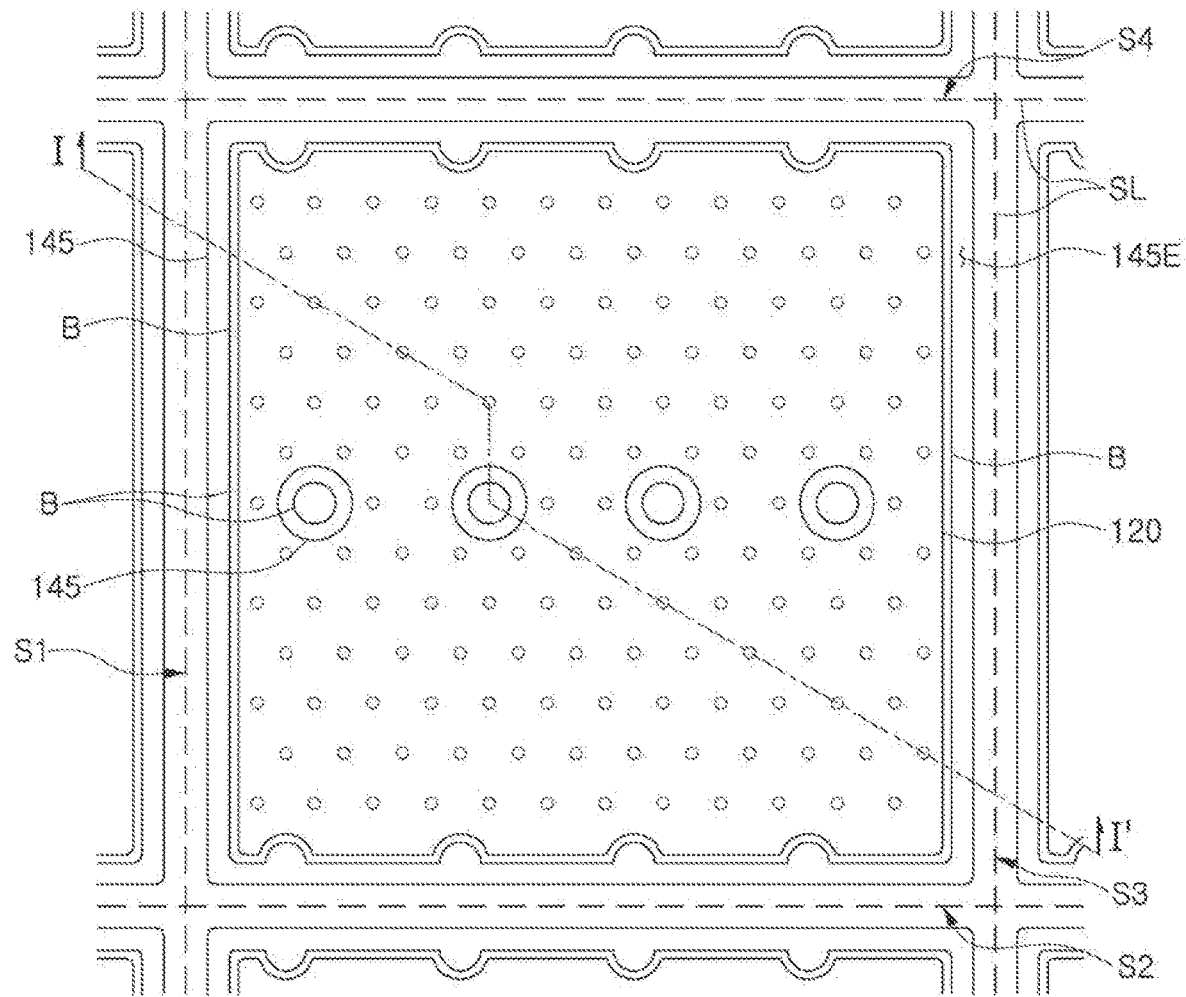
FIGS. 12A, 13A and 14A are diagrams illustrating a method of manufacturing a semiconductor light emitting device according to an example embodiment of the present disclosure.
Figure 12B:
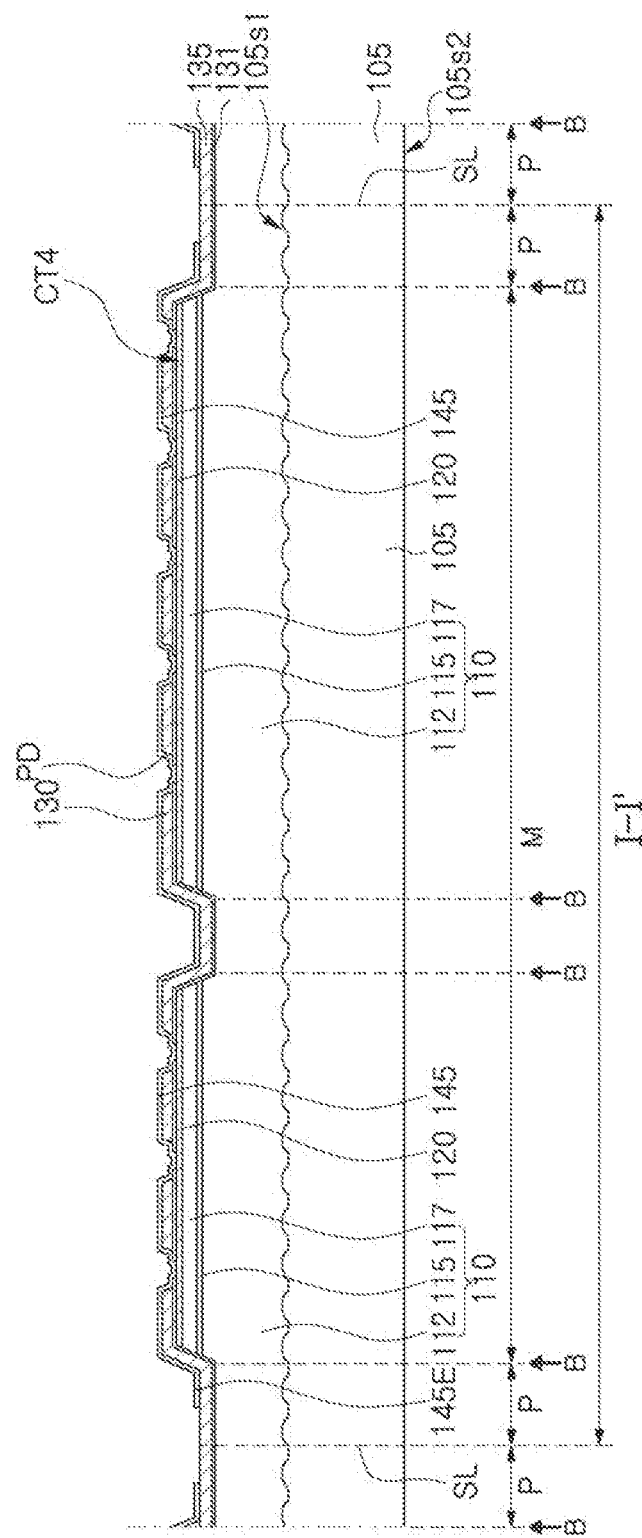
Figure 13A:
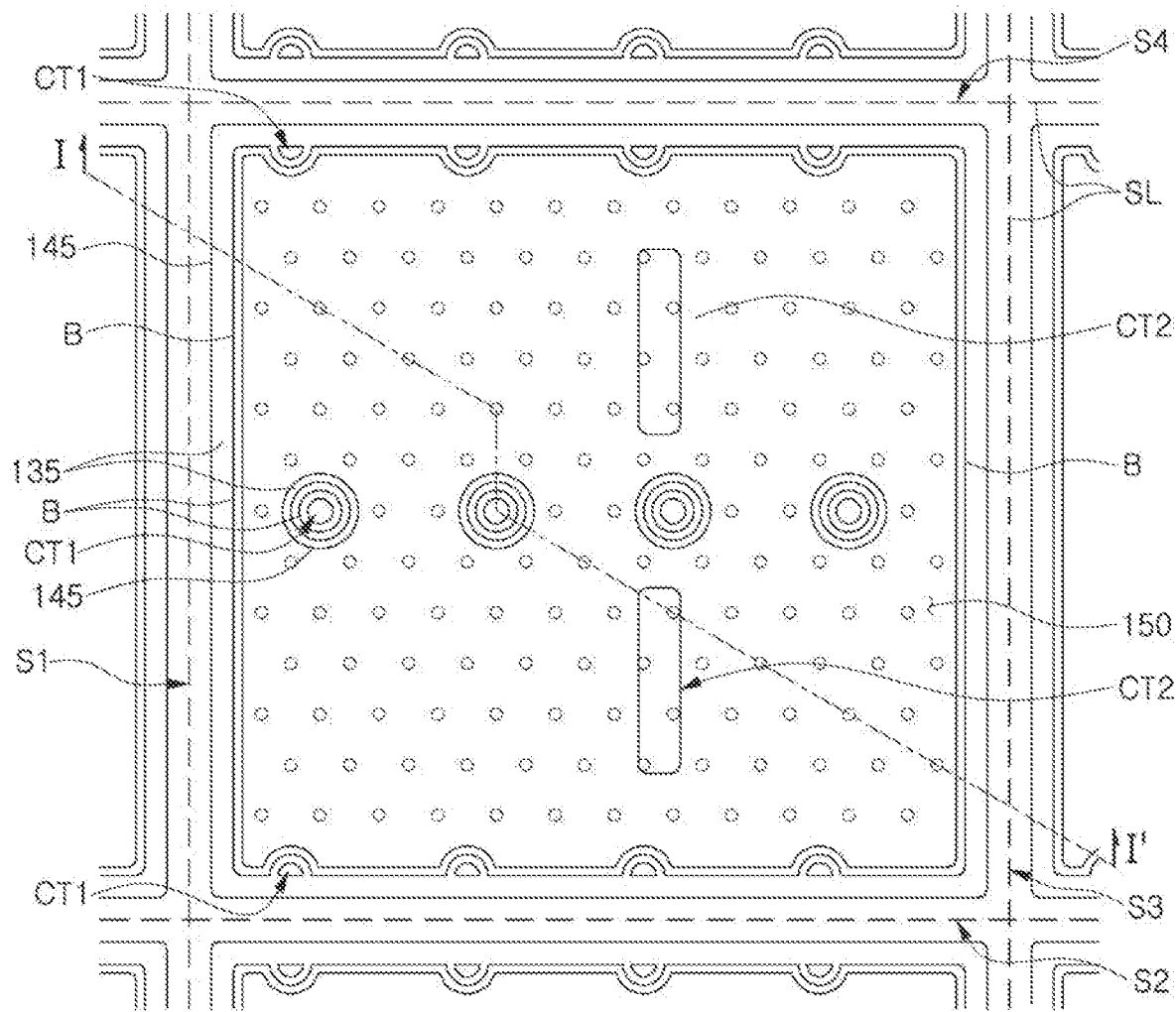
Figure 13B:
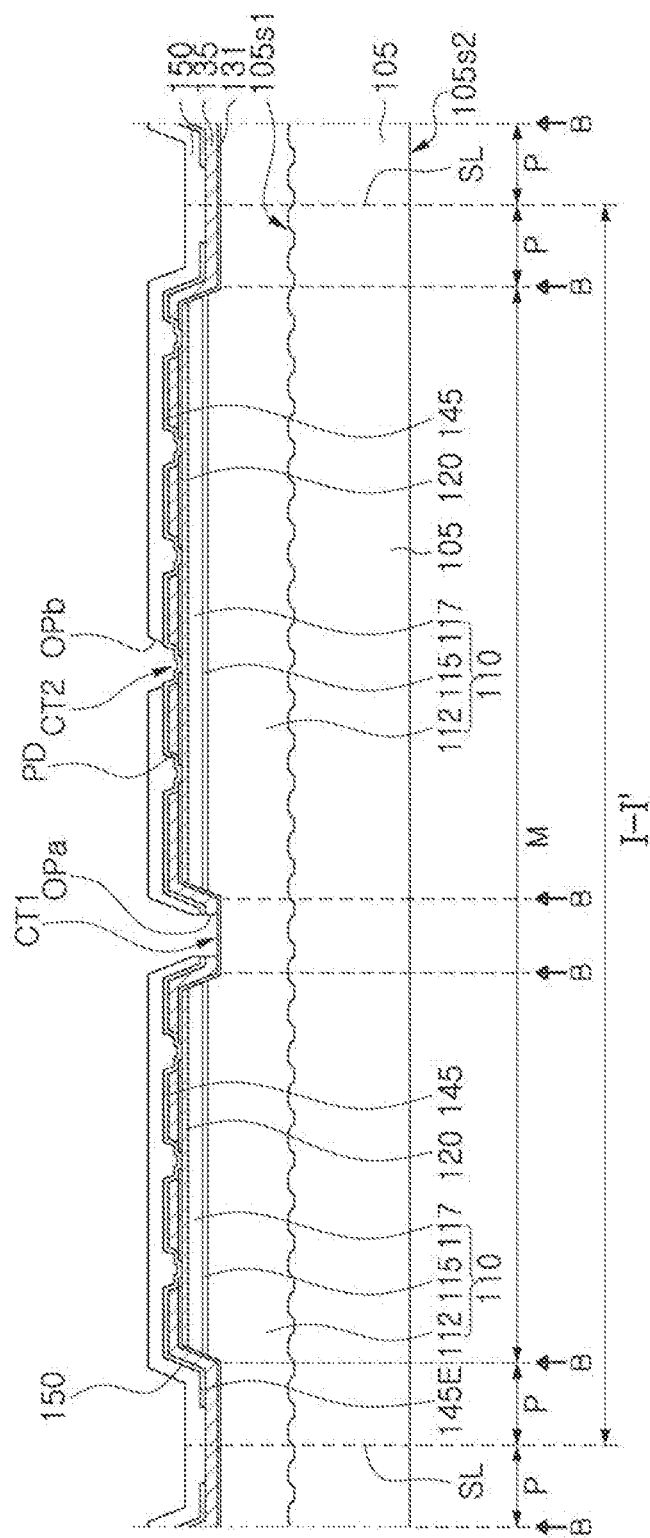
Figure 14A:
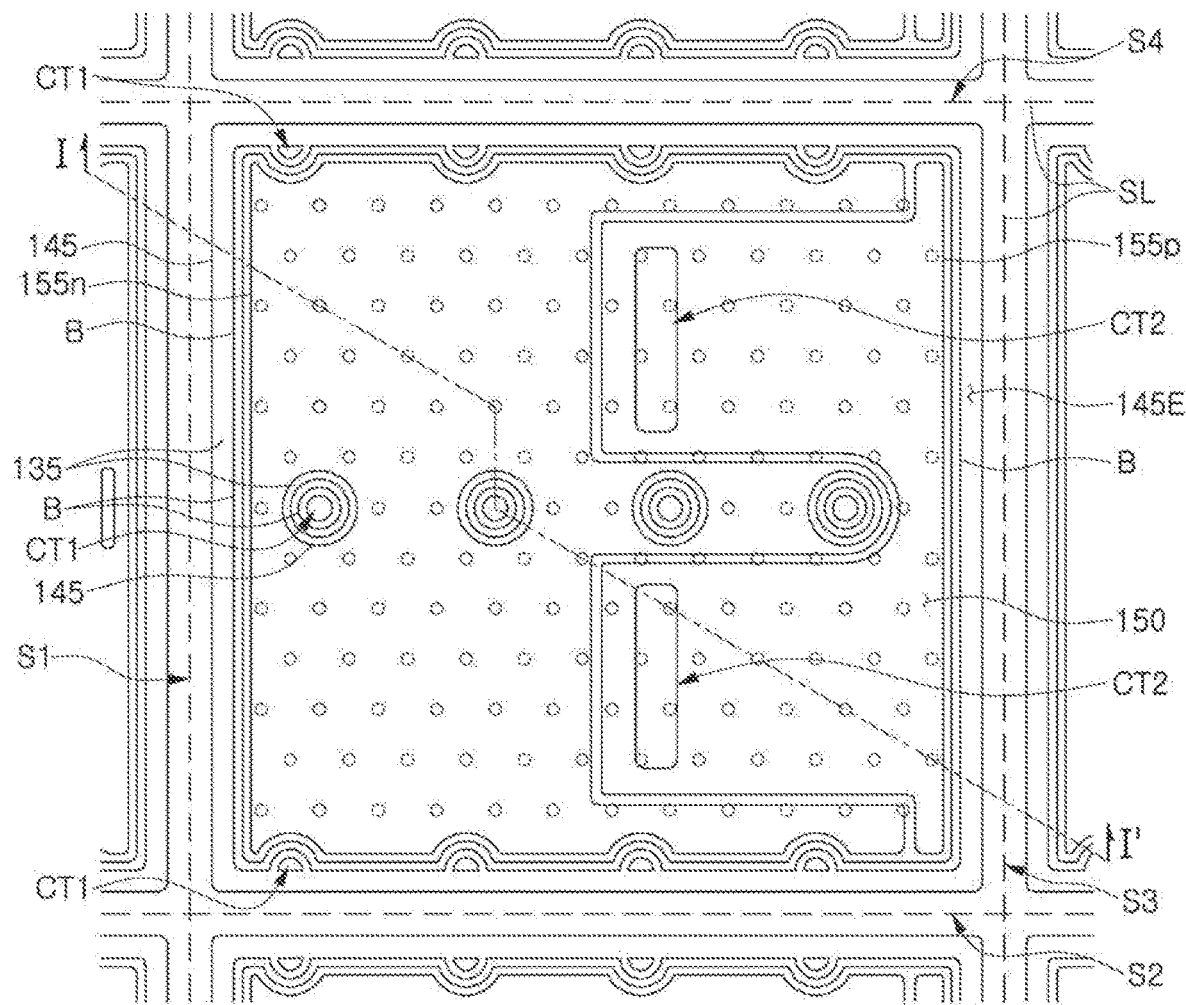
Figure 14B:
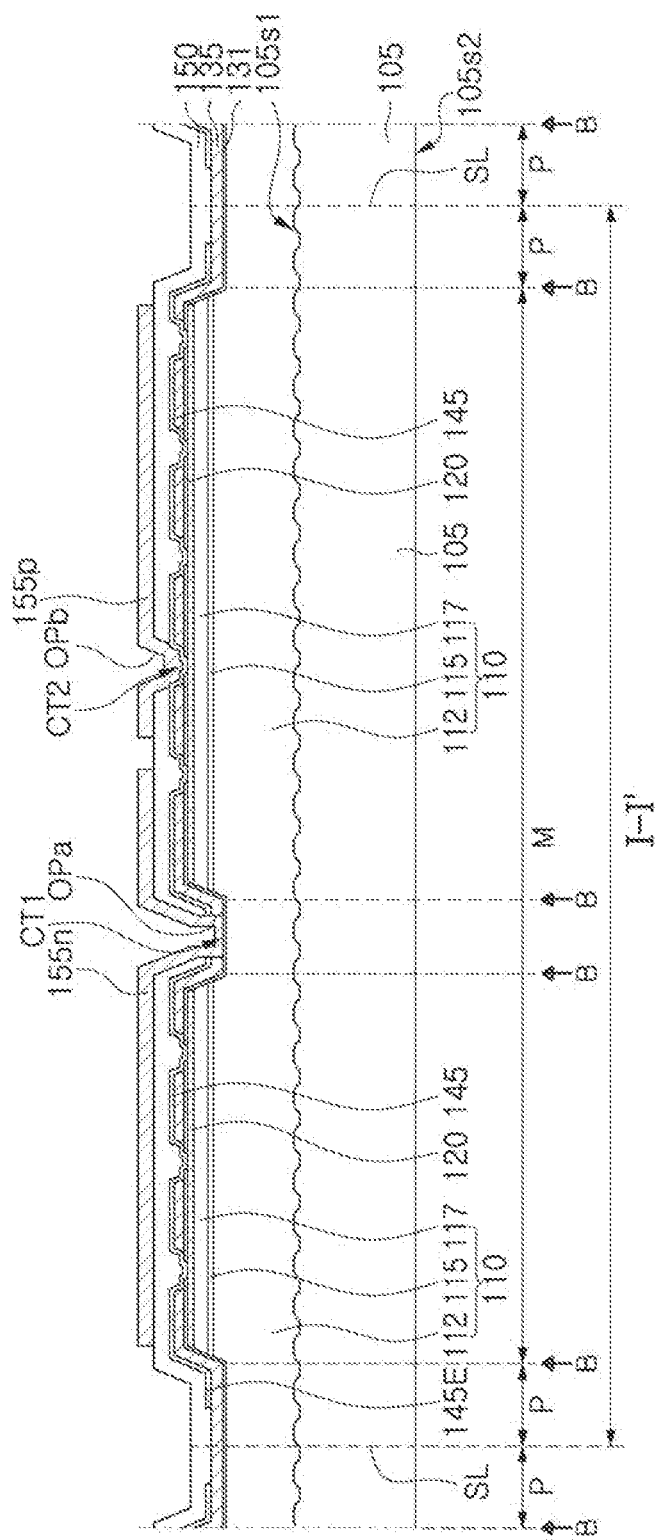

FIGS. 12A, 13A and 14A are diagrams illustrating a method of manufacturing a semiconductor light emitting device according to an example embodiment of the present disclosure. FIGS. 12B, 13B and 14B are cross-sectional diagrams illustrating a semiconductor light emitting device taken along line IT in FIGS. 12A, 13A and 14A, respectively, according to an example embodiment of the present disclosure.

Referring to FIGS. 12A and 12B, a reflective electrode layer 145 may be formed on the DBR layer 135. The reflective electrode layer 145 may be formed on the main region M, and may be formed on one region of the DBR layer 135. The reflective metal layer 145 employed in the example embodiment may have a portion 145E extending to the region of the DBR layer 135 disposed on the peripheral region P of the first conductivity-type semiconductor layer 112. A portion of the reflective electrode layer 145 may be removed from the scribe lane SL and the region around the scribe lane SL. Accordingly, the extended portion 145E of the reflective electrode layer 145 may be disposed to be spaced apart from the scribe lane SL of the first conductivity-type semiconductor layer 112. As such, by increasing the region of the reflective electrode layer 145 covering the light emitting structure 110, light extraction efficiency may greatly improve.

Referring to FIGS. 13A and 13B, the second insulating layer 150 may be formed on the reflective electrode layer 145. The second insulating layer 150 may cover an upper surface and a side surface of the reflective electrode layer 145. The second insulating layer 150 may cover a portion of the DBR layer 135 adjacent to the reflective electrode layer 145. For example, a photoresist pattern exposing a region in which the second insulating layer 150 is to be formed may be formed, and the second insulating layer 150 may be formed by a physical deposition process such as sputtering.

A first opening OPa for opening the first contact region CT1 of the first conductivity-type semiconductor layer 112 and a second opening OPb for opening the second contact region CT2 of the reflective electrode layer 145 may be formed by selectively removing the DBR layer 135 and the second insulating layer 150. The first opening OPa may be disposed in a recessed region in the mesa structure, and the second opening OPb may be disposed on the mesa structure.

Referring to FIGS. 14A and 14B, a first connection electrode 155n and a second connection electrode 155p may be formed on the second insulating layer 150.

The forming the first connection electrode 155n and the second connection electrode 155p may include forming a conductive material layer on the substrate 105 having the second insulating layer 150, and etching a portion of the conductive material layer using photographing and etching processes. Since the first connection electrode 155n and the second connection electrode 155p are formed by the same process, the first connection electrode 155n and the second connection electrode 155p may be formed of the same material. The first connection electrode 155n and the second connection electrode 155p may have the same thickness.

The first connection electrode 155n may be electrically connected to the first contact region CT1 of the first conductivity-type semiconductor layer 112. The second connection electrode 155p may be electrically connected to the second contact region CT2 of the reflective electrode layer 145.

Referring back to FIGS. 1 and 2, a third insulating layer 160 having a third opening 160a and a fourth opening 160b may be formed on the substrate 105 having the first connection electrode 155n and the second connection electrode 155p.

The third opening 160a of the third insulating layer 160 may expose a partial region of the first connection electrode 155n, and the fourth opening 160b of the third insulating layer 160 may expose a partial region of the second connection electrode 155p.

A partial region of the first connection electrode 155n exposed by the third opening 160a of the third insulating layer 160 may be referred to as a third contact region CT3, and a partial region of the second connection electrode 155p exposed by the fourth opening 160b of the insulating layer 160 may be referred to as a fourth contact region CT4.

First and second electrode pads 165n and 165p may be formed on the substrate 105 having the third insulating layer 160. The first electrode pad 165n may be formed on the third contact region CT3 of the first connection electrode 155n, and the second electrode pad 165p may be formed on the fourth contact region CT4 of the second connection electrode 155p. The first and second electrode pads 165n and 165p may be under bump metallurgy (UBM). In an example, the number of the first and second electrode pads 165n and 165p and arrangement of the first and second electrode pads 165n and 165p may be varied.

First and second solder pillars 170n and 170p may be formed on the substrate 105 having the first and second electrode pads 165n and 165p. The first solder pillar 170n may be formed on the first electrode pad 165n, and the second solder pillar 170p may be formed on the second electrode pad 165p. A molding portion 172 covering side surfaces of the first and second solder pillars 170n and 170p may be formed.

According to the aforementioned example embodiments, by extending the reflective metal layer to the region (or the peripheral region) adjacent to the edge of the device on the dielectric reflective structure such as the DBR layer, the light extraction efficiency of the semiconductor light emitting device may greatly improve.

In the semiconductor light emitting device according to example embodiments, a dielectric reflective structure (e.g., DBR or ODR) having excellent reflective properties may be additionally employed on the insulating layer covering the mesa structure. The DBR layer may include an insulating film different from the insulating layer. When forming the opening for opening the contact region of the transparent electrode layer, the opening of the insulating layer may be formed (e.g., by wet etching) after the opening of the DBR layer is formed (e.g., by dry etching). Since the insulating layer portion disposed in the side surface and edge region of the mesa structure is protected by the DBR layer, defects may be prevented, and short-circuit defects may be fundamentally prevented, even when the reflective electrode layer is extended. Also, the extended portion of the reflective electrode layer may extend to the edge region, but to prevent defects during the chip cutting process, the extended portion may be spaced apart from the edge by a predetermined distance (e.g., 5 µm or more).

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor light emitting device, comprising:
    a light emitting structure comprising:
        a first conductivity-type semiconductor layer comprising an upper surface having a first region and a second region surrounding the first region,
        an active layer; and
        a second conductivity-type semiconductor layer, the active layer and the second conductivity-type semiconductor layer being provided in sequence on the first region;
    a transparent electrode layer provided on the second conductivity-type semiconductor layer;
    an insulating layer provided on the light emitting structure, and covering the transparent electrode layer;
    a distributed Bragg reflector (DBR) layer provided on the insulating layer, the DBR comprising:
        a first insulating film having a first refractive index; and
        a second insulating film having a second refractive index different from the first refractive index,
        wherein the insulating layer and the DBR layer comprises a plurality of holes connected to a contact region of the transparent electrode layer; and
    a reflective electrode layer provided on the DBR layer, and connected to the contact region of the transparent electrode layer through the plurality of holes, the reflective electrode layer comprising an extended portion extending to the DBR layer region on the first region of the first conductivity-type semiconductor layer.

2. The semiconductor light emitting device of claim 1, wherein at least one of the first insulating film and the second insulating film comprises a material different from a material of the insulating layer.

3. The semiconductor light emitting device of claim 2, wherein the first insulating film and the insulating layer comprise $SiO_2$, and
    wherein the second insulating film comprises $TiO_2$ or $Nb_2O_5$.

4. The semiconductor light emitting device of claim 1, wherein the second region is an edge region adjacent to each edge of the first conductivity-type semiconductor layer, and
    wherein the second region surrounds the first region.

5. The semiconductor light emitting device of claim 4, wherein the extended portion of the reflective electrode layer is spaced apart by a first distance from each edge of the first conductivity-type semiconductor layer.

6. The semiconductor light emitting device of claim 5, wherein the first distance is about 5 µm to about 20 µm.

7. The semiconductor light emitting device of claim 4, wherein the extended portion of the reflective electrode layer has a length of about 5 µm to about 10 µm.

8. The semiconductor light emitting device of claim 4, wherein a width of the first region is at least about 10 µm.

9. The semiconductor light emitting device of claim 8, the extended portion of the reflective electrode layer is spaced apart by a first distance from each edge of the first conductivity-type semiconductor layer, and
    wherein the first distance is in a range of about 50% to about 70% of a width of the first region.

10. The semiconductor light emitting device of claim 1, wherein the transparent electrode layer comprises indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminum-doped zinc oxide (AZO), gallium-doped zinc oxide (GZO), $In_4Sn_3O_{12}$ or $Zn_{(1-x)}Mg_xO$.

11. The semiconductor light emitting device of claim 1, wherein the reflective electrode layer comprises at least one of Ag, Cr, Ni, Ti, Al, Rh, and Ru.

12. The semiconductor light emitting device of claim 1, wherein each of the plurality of holes comprises a first opening formed in the insulating layer and a second opening formed in the DBR layer, and
    wherein the second opening is larger than the first opening.

13. The semiconductor light emitting device of claim 1, wherein the contact region of the transparent electrode layer that is exposed by the plurality of holes is at a level lower than a level of a non-contact region of the transparent electrode layer.

14. The semiconductor light emitting device of claim 1, wherein the first insulating film of the DBR layer comprises a material that is the same as a material of the insulating layer, and
wherein the first insulating film and the insulating layer comprise a visually distinct interfacial surface therebetween.

15. A semiconductor light emitting device, comprising:
a light emitting structure comprising:
a first conductivity-type semiconductor layer comprising an upper surface having a main region and a peripheral region surrounding the main region,
an active layer, and
a second conductivity-type semiconductor layer, the active layer and the second conductivity-type semiconductor layer being provided in sequence on the main region;
a transparent electrode layer provided on the second conductivity-type semiconductor layer;
an insulating layer provided on the light emitting structure and covering the transparent electrode layer;
a distributed Bragg reflector (DBR) layer provided on the insulating layer, the DBR layer comprising:
a first insulating film having a first refractive index; and
a second insulating film having a second refractive index that is different from the first refractive index, wherein each of the insulating layer and the DBR layer comprises a plurality of holes connected to a contact region of the transparent electrode layer;
a reflective electrode layer provided on the DBR layer, and connected to the contact region of the transparent electrode layer through the plurality of holes, the reflective electrode layer comprising an extended portion provided on the peripheral region of the first conductivity-type semiconductor layer and extending to the DBR layer region, wherein the extended portion is spaced apart from each edge of the first conductivity-type semiconductor layer by a first distance;
a second insulating layer provided on the DBR layer and covering the reflective electrode layer, the second insulating layer comprising at least one opening exposing one region of the reflective electrode layer; and
a connection electrode provided on the second insulating layer and connected to the reflective electrode layer through the at least one opening of the second insulating layer.

16. The semiconductor light emitting device of claim 15, wherein the connection electrode comprises a portion extending into a region of the second insulating layer provided on the peripheral region.

17. The semiconductor light emitting device of claim 16, wherein the connection electrode comprises at least one of Al, Au, W, Pt, Si, Ir, Ag, Cu, Ni, Ti, and Cr.

18. The semiconductor light emitting device of claim 15, further comprising:
a third insulating layer provided on the second insulating layer and comprising an opening exposing a first region of the connection electrode; and
an electrode pad provided on the first region of the connection electrode.

19. The semiconductor light emitting device of claim 15, wherein a width of the peripheral region is in a range of about 10 µm to about 30 µm, and
wherein the first distance is in a range of about 50% to about 70% of a width of the peripheral region.

20. A semiconductor light emitting device, comprising:
a light emitting structure comprising:
a first conductivity-type semiconductor layer comprising an upper surface having a main region and a peripheral region surrounding the main region,
an active layer, and
a second conductivity-type semiconductor layer, the active layer and the second conductivity-type semiconductor layer being provided in sequence on the main region, wherein the peripheral region has a width of at least about 10 µm;
a transparent electrode layer provided on the second conductivity-type semiconductor layer;
a first insulating layer provided on the light emitting structure, and covering the transparent electrode layer;
a second insulating layer provided on the first insulating layer and comprising a material different from a material of the first insulating layer, wherein each of the first insulating layer and the second insulating layer comprises a plurality of holes connected to a contact region of the transparent electrode layer;
a reflective electrode layer provided on the second insulating layer, and connected to the contact region of the transparent electrode layer through the plurality of holes, the reflective electrode layer comprising an extended portion extending to a region of the second insulating layer provided on the peripheral region of the first conductivity-type semiconductor layer, wherein the extended portion is spaced apart from each edge of the first conductivity-type semiconductor layer by at least about 5 µm;
a third insulating layer provided on the second insulating layer and covering the reflective electrode layer, the third insulating layer comprising at least one opening exposing one region of the reflective electrode layer; and
a connection electrode provided on the third insulating layer and connected to the reflective electrode layer through the at least one opening of the third insulating layer.

* * * * *